US012598740B2

(12) United States Patent
Kim et al.

(10) Patent No.: US 12,598,740 B2
(45) Date of Patent: Apr. 7, 2026

(54) SEMICONDUCTOR DEVICE

(71) Applicant: Samsung Electronics Co., Ltd.,
Suwon-si (KR)

(72) Inventors: Dong-Wan Kim, Hwaseong-si (KR);
Keonhee Park, Suwon-si (KR);
Dong-Sik Park, Suwon-si (KR);
Joonsuk Park, Suwon-si (KR); **Jihoon
Chang, Yongin-si (KR); Hyeon-Woo
Jang**, Hwaseong-si (KR)

(73) Assignee: **SAMSUNG ELECTRONICS CO.,
LTD.**, Suwon-si (KR)

( * ) Notice: Subject to any disclaimer, the term of this
patent is extended or adjusted under 35
U.S.C. 154(b) by 576 days.

(21) Appl. No.: 17/857,395

(22) Filed: Jul. 5, 2022

(65) Prior Publication Data

US 2023/0041059 A1     Feb. 9, 2023

(30) Foreign Application Priority Data

Aug. 4, 2021     (KR) ......................... 10-2021-0102342

(51) Int. Cl.
*H10B 12/00*          (2023.01)
(52) U.S. Cl.
CPC ............. *H10B 12/50* (2023.02); *H10B 12/09*
(2023.02); *H10B 12/315* (2023.02); *H10B*
*12/34* (2023.02)
(58) Field of Classification Search
CPC .... H10B 12/485; H10B 12/50; H10B 12/482;
H10B 12/315; H10B 12/31; H10B
12/488; H10B 12/09
See application file for complete search history.

(56) References Cited

U.S. PATENT DOCUMENTS

| | | | |
|---|---|---|---|
| 8,330,253 B2 | 12/2012 | Tomita | |
| 9,178,026 B2 | 11/2015 | Seo | |
| 10,490,555 B2 | 11/2019 | Chang et al. | |
| 10,535,532 B2 | 1/2020 | Fan et al. | |
| 2012/0012911 A1 | 1/2012 | Jeong | |
| 2018/0350818 A1* | 12/2018 | Yoon | H10B 12/485 |
| 2018/0350905 A1 | 12/2018 | Yoon et al. | |
| 2019/0355728 A1* | 11/2019 | Kim | H10B 12/033 |
| 2021/0082924 A1 | 3/2021 | Seong et al. | |
| 2021/0098460 A1* | 4/2021 | Lee | H10B 12/053 |
| 2021/0193664 A1* | 6/2021 | Seong | H10B 12/34 |
| 2021/0272961 A1* | 9/2021 | Tung | H10B 12/34 |

FOREIGN PATENT DOCUMENTS

| | | |
|---|---|---|
| CN | 113192954 A | 7/2021 |
| JP | 2014086450 A | 5/2014 |
| KR | 1020120067678 A | 6/2012 |
| KR | 10-2021-0037211 A | 4/2021 |

* cited by examiner

*Primary Examiner* — Dale E Page
*Assistant Examiner* — Douglas Yap
(74) *Attorney, Agent, or Firm* — Muir Patent Law, PLLC

(57)          ABSTRACT

A semiconductor device may include a substrate including a
cell region, a peripheral region, and a boundary region
between the cell region and the peripheral region, bit lines
provided on the cell region and extended in a first direction
parallel to a top surface of the substrate, bit line capping
patterns provided on the bit lines, and a boundary pattern
provided on the boundary region. End portions of the bit
lines may be in contact with a first interface of the boundary
pattern, and the bit line capping patterns may include the
same material as the boundary pattern.

19 Claims, 27 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2021-0102342, filed on Aug. 4, 2021, in the Korean Intellectual Property Office, the entire contents of which are hereby incorporated by reference.

BACKGROUND OF THE INVENTION

The present disclosure relates to a semiconductor device and a method of fabricating the same, and in particular, to a semiconductor device, which includes patterned bit lines provided in a cell block, and a method of fabricating the same.

Due to their small-size, multifunctional capabilities, and/or low-cost characteristics, semiconductor devices are important elements in the electronics industry. Semiconductor devices are classified into a semiconductor memory device for storing data, a semiconductor logic device for processing data, and a hybrid semiconductor device including both of memory and logic elements.

Due to the increasing demand for electronic devices with a fast speed and/or low power consumption, a fast operating speed and/or a low operating voltage are requirements of a semiconductor device. To satisfy the requirements, it is necessary to increase an integration density of the semiconductor device. However, an increase in the integration density of the semiconductor device may lead to deterioration in reliability of the semiconductor device. In addition, as the electronics industry is highly developed, there is an increasing demand for a highly-reliable semiconductor device. Thus, many studies are being conducted to realize a highly-integrated and highly-reliable semiconductor device.

SUMMARY

An embodiment of the inventive concept provides a semiconductor device configured to prevent or suppress a pattern defect caused by a reduction in linewidth of patterns.

According to an embodiment of the inventive concept, a semiconductor device may include a substrate including a cell region, a peripheral region, and a boundary region between the cell region and the peripheral region, bit lines provided on the cell region and extended in a first direction parallel to a top surface of the substrate, bit line capping patterns provided on the bit lines, and a boundary pattern provided on the boundary region. End portions of the bit lines may be in contact with a first interface of the boundary pattern, and the bit line capping patterns may include the same material as the boundary pattern.

According to an embodiment of the inventive concept, a semiconductor device may include a substrate including a cell region, a peripheral region, and a boundary region between the cell region and the peripheral region, bit lines provided on the cell region and extended in a first direction parallel to a top surface of the substrate, bit line capping patterns on the bit lines, cell trenches provided between the bit lines and extended from the cell region to the boundary region in the first direction, and a boundary pattern provided on the boundary region. The cell trenches may include first end portions which are extended into the boundary pattern, and the bit line capping patterns may include the same material as the boundary pattern.

According to an embodiment of the inventive concept, a semiconductor device may include a substrate including a cell region, a peripheral region, and a boundary region between the cell region and the peripheral region, bit lines provided on the cell region and extended in a first direction parallel to a top surface of the substrate, bit line capping patterns on the bit lines, storage node contacts disposed between the bit lines, landing pads provided on the bit line capping patterns and the storage node contacts, and electrically connected to the storage node contacts, capacitors provided on the landing pads and electrically connected to the landing pads, cell trenches provided between the bit lines and extended from the cell region to the boundary region in the first direction, and a boundary pattern provided on the boundary region. End portions of the bit lines may be in contact with a first interface of the boundary pattern. The cell trenches may include first end portions extended into the boundary pattern, and the bit line capping patterns may include the same material as the boundary pattern.

DETAILED DESCRIPTION

Example embodiments of the inventive concepts will now be described more fully with reference to the accompanying drawings, in which example embodiments are shown.

Figure 1:
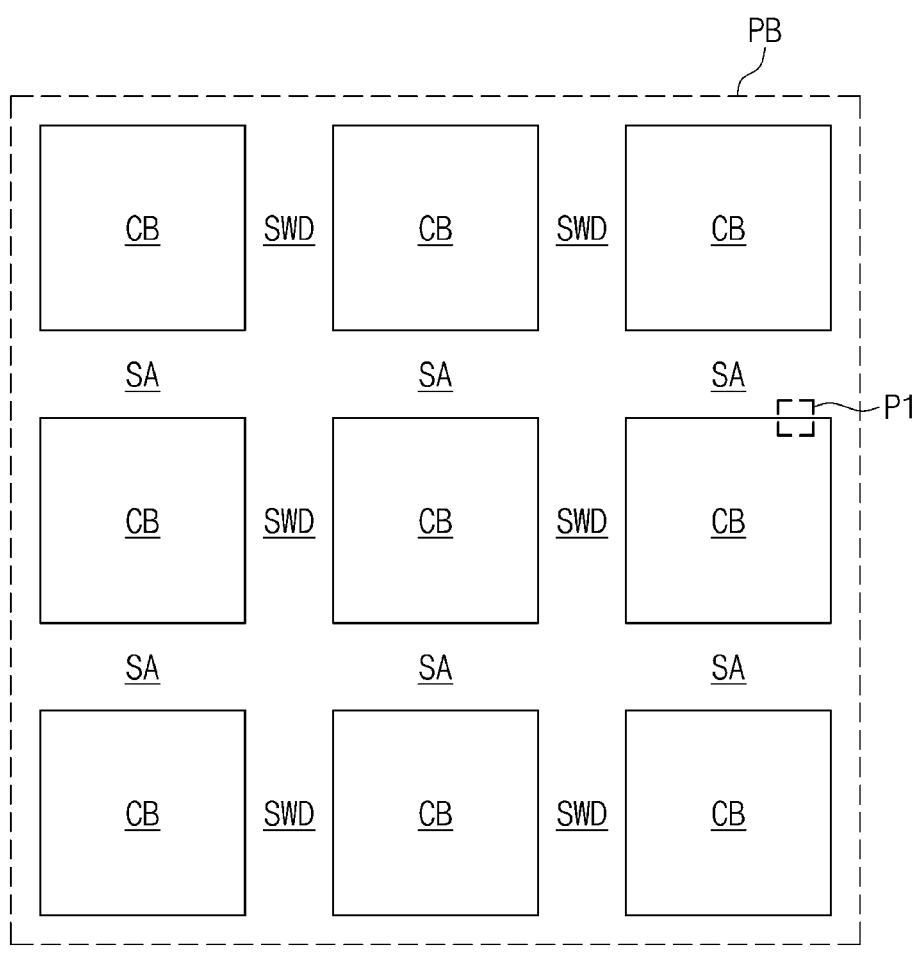
FIG. 1 is a block diagram illustrating a semiconductor device according to an embodiment of the inventive concept.

FIG. 1 is a block diagram illustrating a semiconductor device according to an embodiment of the inventive concept.

Referring to FIG. 1, a semiconductor device may include cell blocks CB and a peripheral block PB, which is provided to surround each of the cell blocks CB. The semiconductor device may be a memory device, and each of the cell blocks CB may include a cell circuit (e.g., a memory integrated circuit). The peripheral block PB may include various peripheral circuits, which are used to operate the cell circuit, and the peripheral circuits may be electrically connected to the cell circuit. As used herein, items described as being "electrically connected" are configured such that an electrical signal can be passed from one item to the other.

The peripheral block PB may include sense amplifier circuits SA and sub-word line driver circuits SWD. In an embodiment, the sense amplifier circuits SA may be provided to face each other with the cell blocks CB interposed therebetween, and the sub-word line driver circuits SWD may be provided to face each other with the cell blocks CB interposed therebetween. The peripheral block PB may further include power and ground circuits for driving a sense amplifier, but the inventive concept is not limited to this example.

Figure 2:
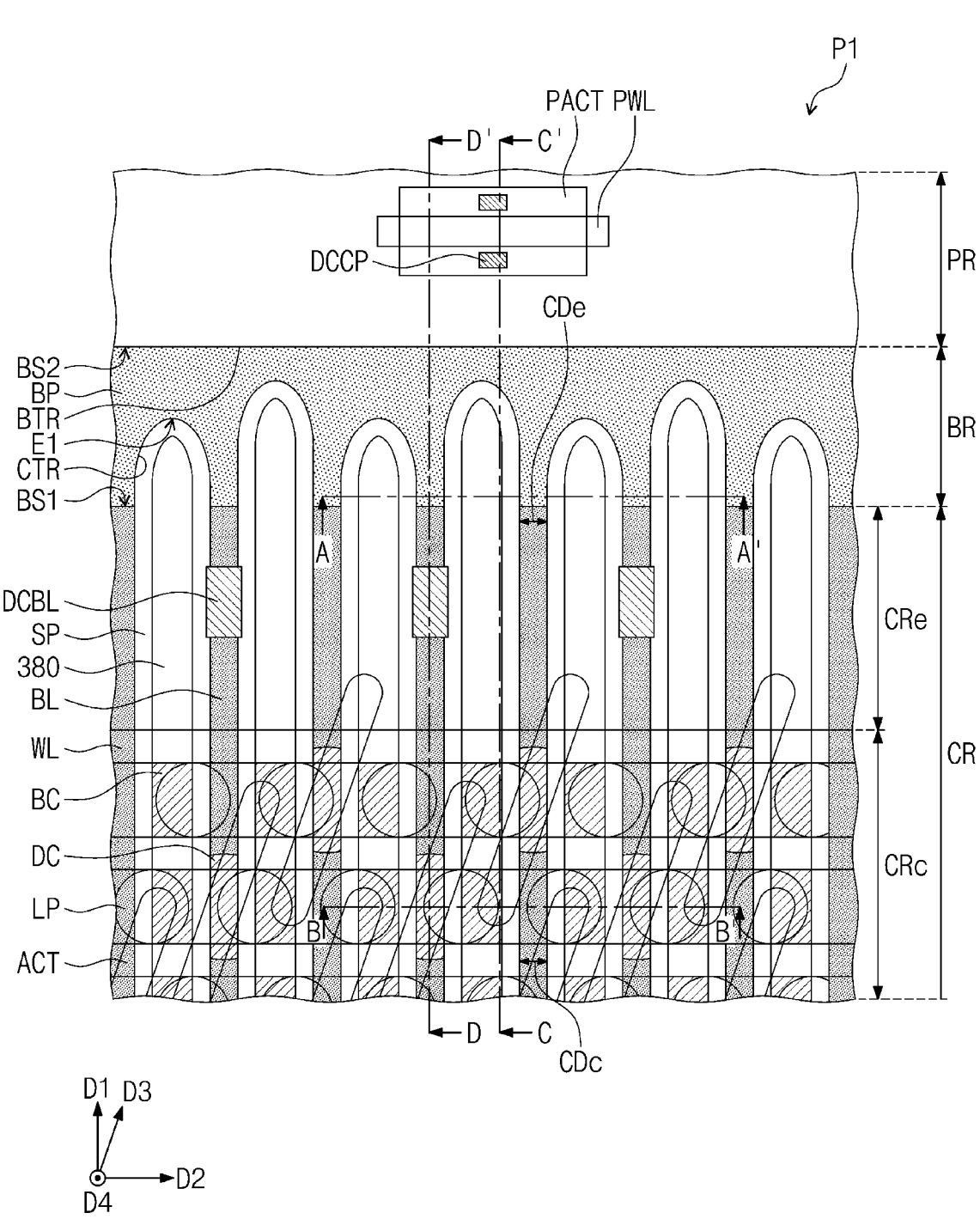
FIG. 2 is a plan view illustrating a portion (e.g., a portion 'P1' of FIG. 1) of a semiconductor device according to an embodiment of the inventive concept.
Figure 3:
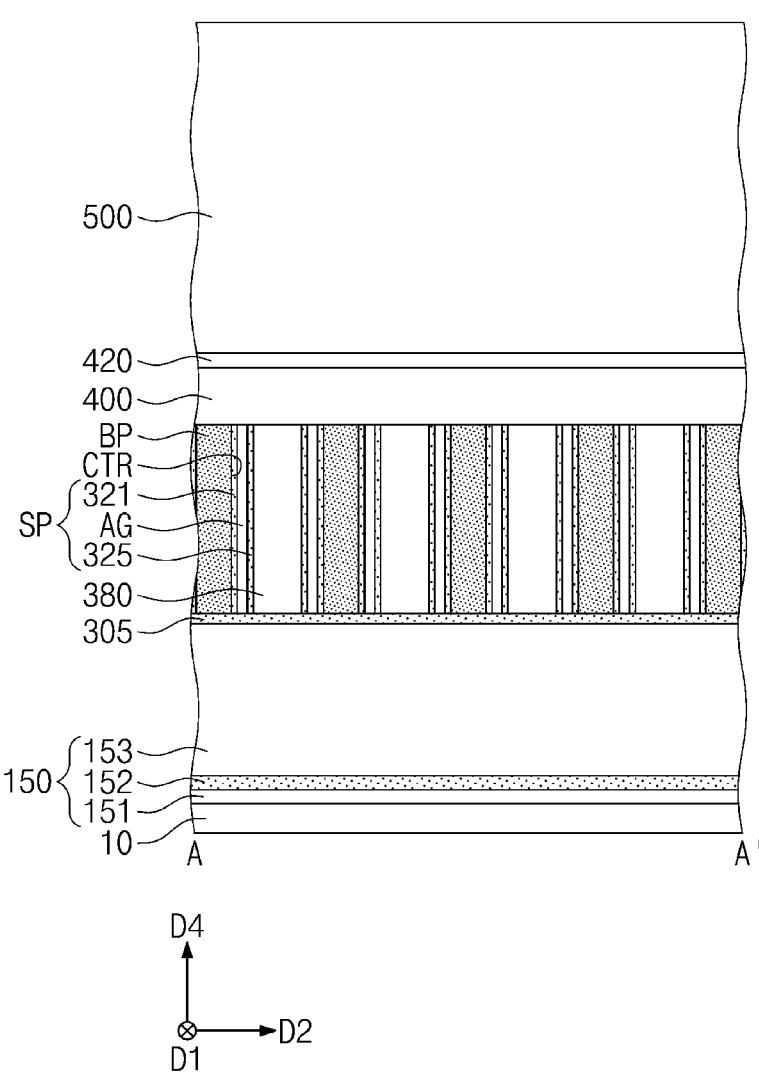
FIGS. 3 to 6 are sectional views taken along lines A-A', B-B', C-C', D-D' of FIG. 2, respectively.
Figure 4:
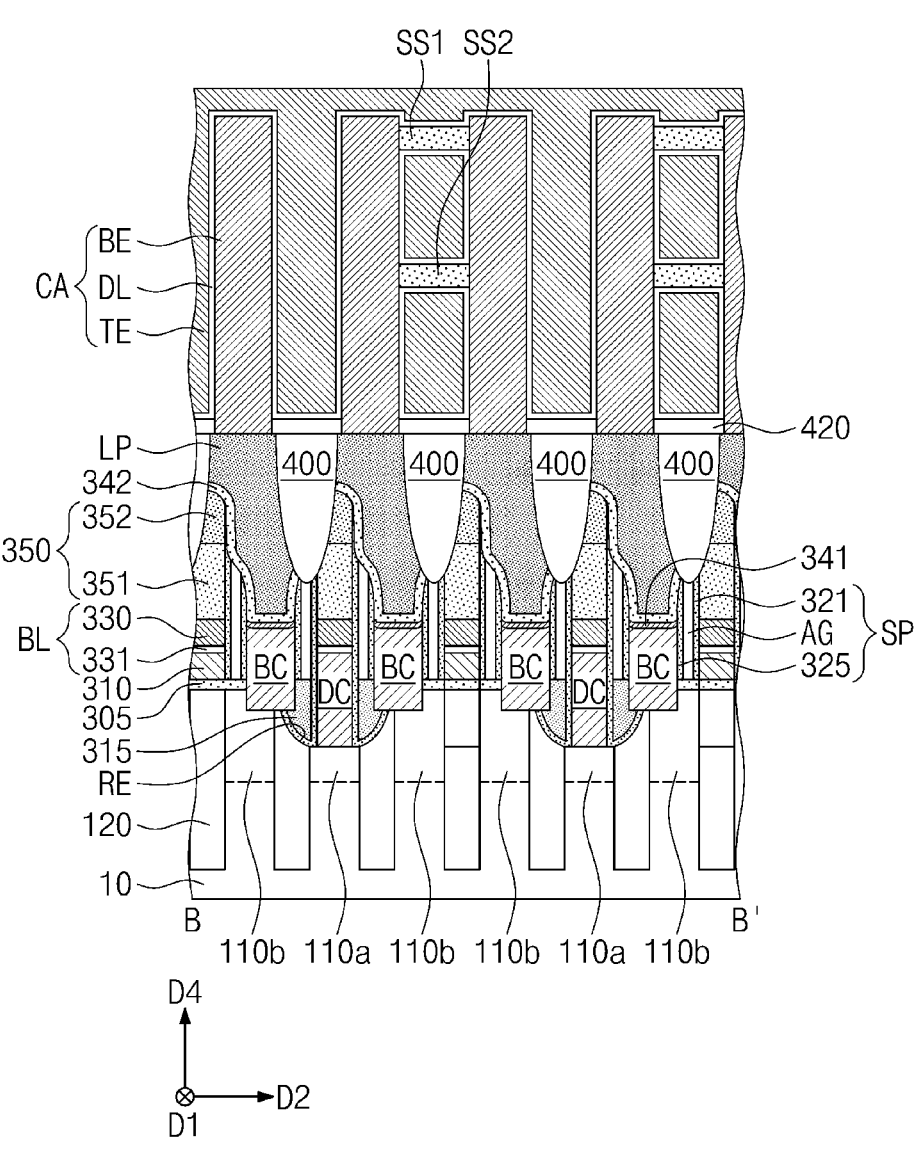
Figure 5:
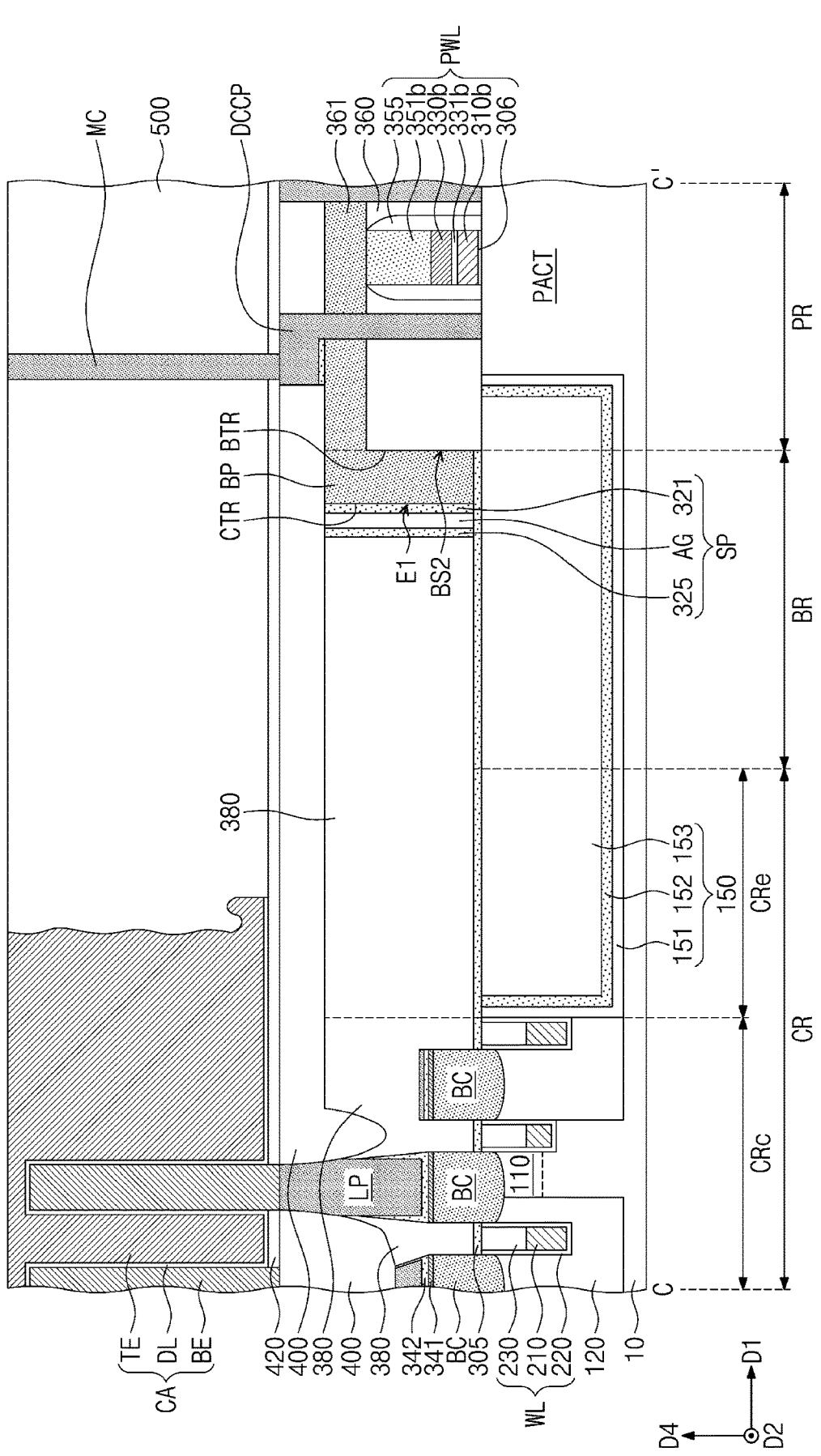
Figure 6:
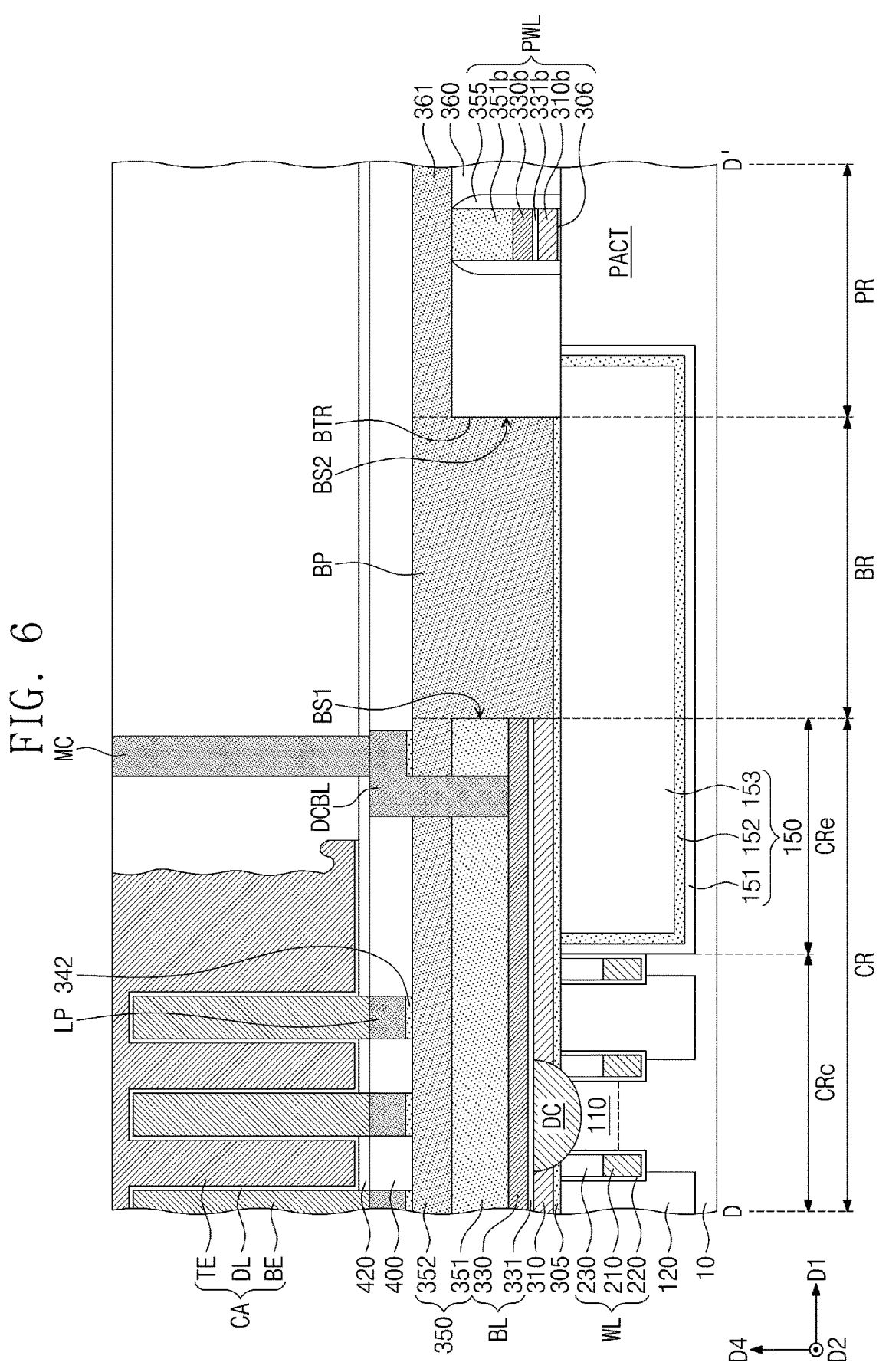
Figure 7:
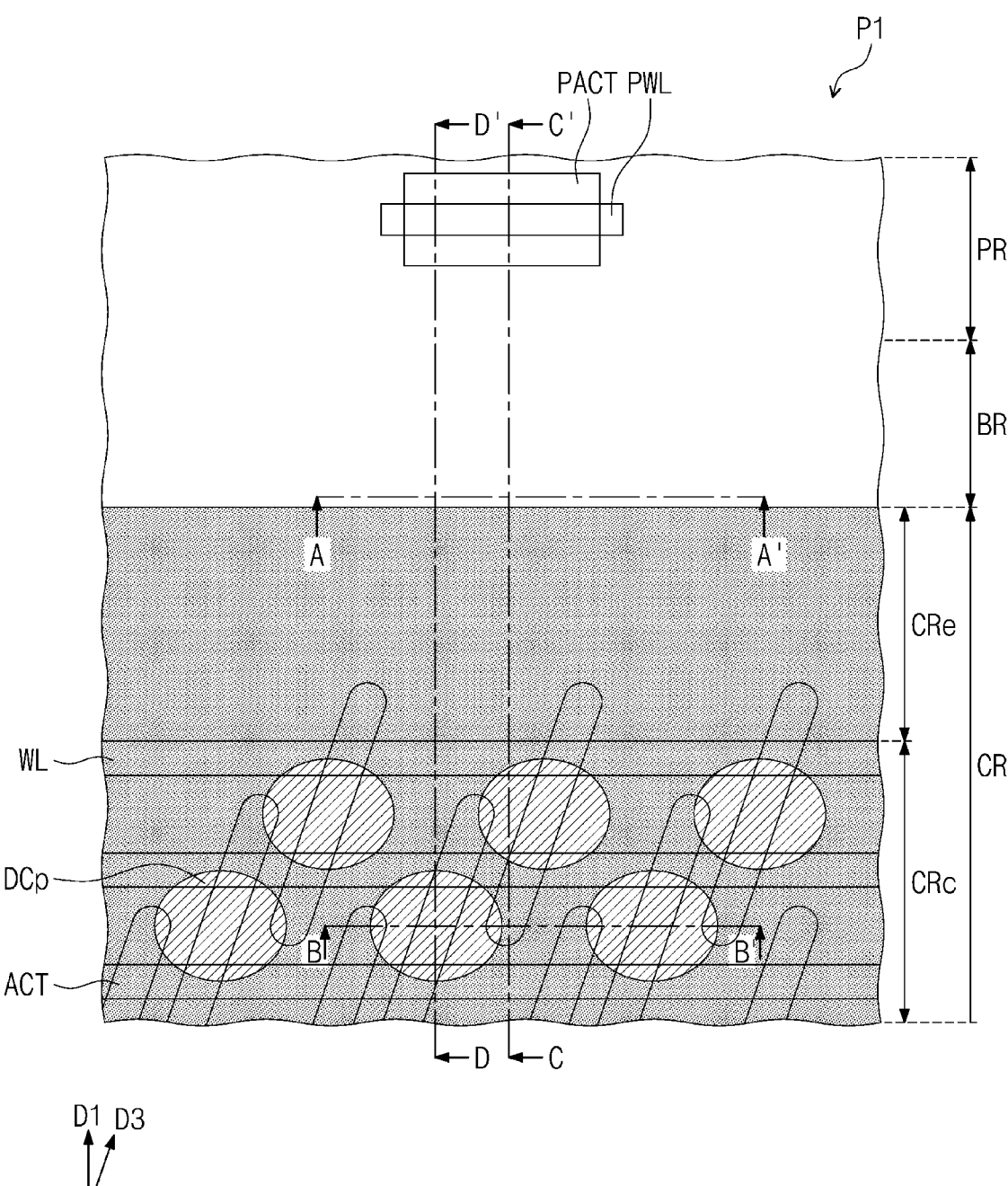
FIGS. 7, 12, 17, 22, and 27 are plan views illustrating a method of fabricating a semiconductor device according to an embodiment of the inventive concept and, in particular, to corresponding to the portion 'P1' of FIG. 1.
Figure 8:
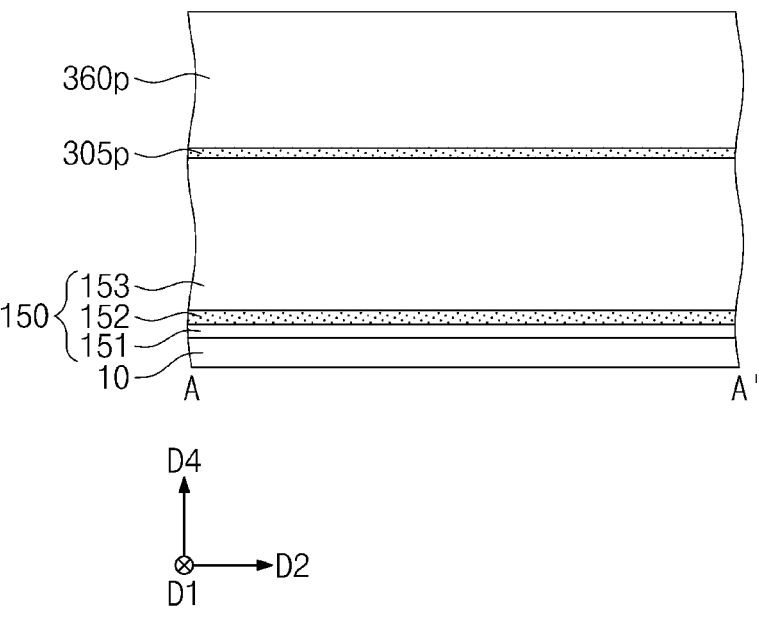
FIGS. 8, 13, 18, 23, and 28 are sectional views taken along lines A-A' of FIGS. 7, 12, 17, 22, and 27, respectively.
Figure 9:
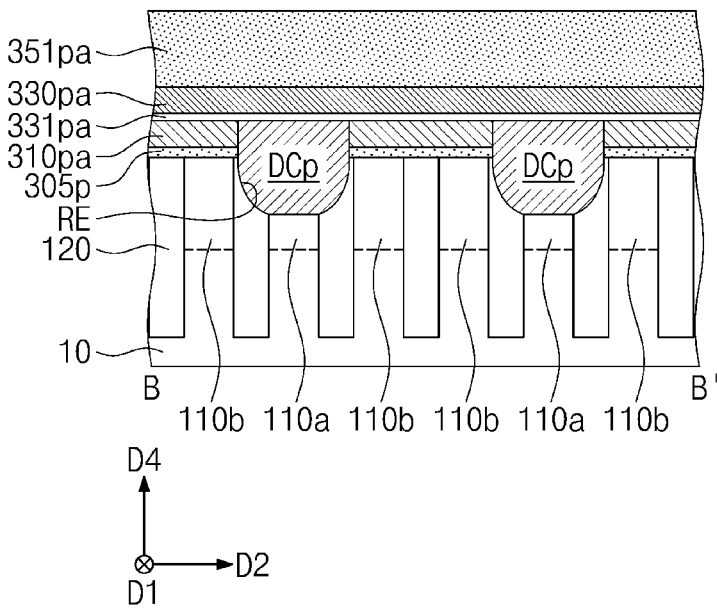
FIGS. 9, 14, 19, 24, and 29 are sectional views taken along lines B-B' of FIGS. 7, 12, 17, 22, and 27, respectively.
Figure 10:
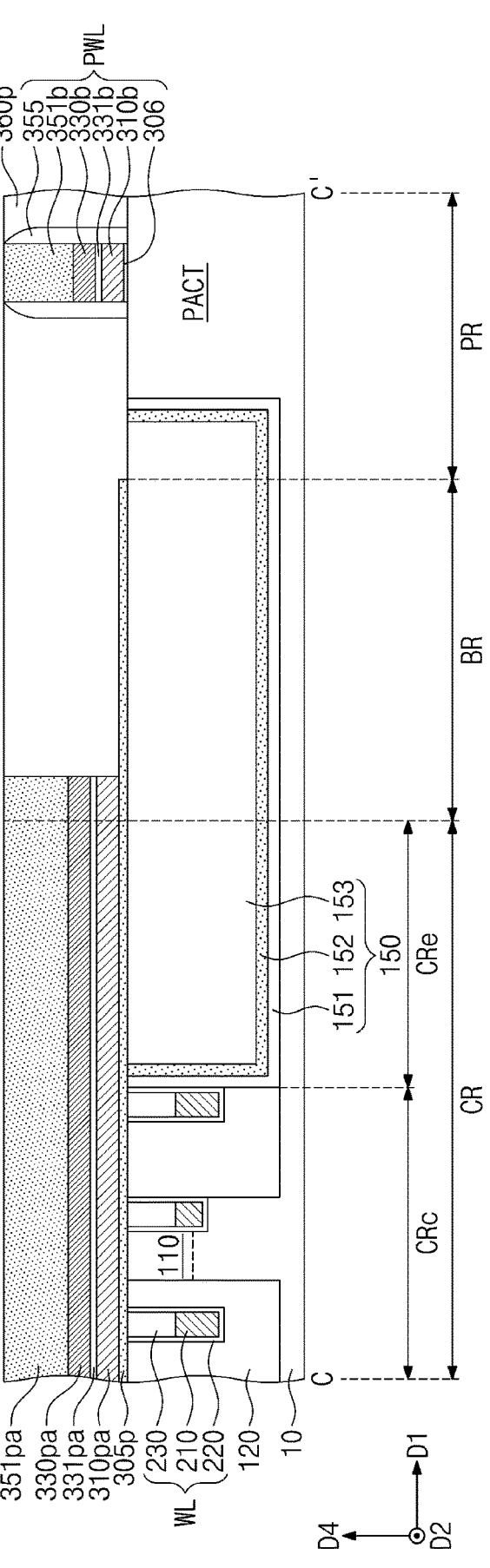
FIGS. 10, 15, 20, 25, and 30 are sectional views taken along lines C-C' of FIGS. 7, 12, 17, 22, and 27, respectively.
Figure 11:
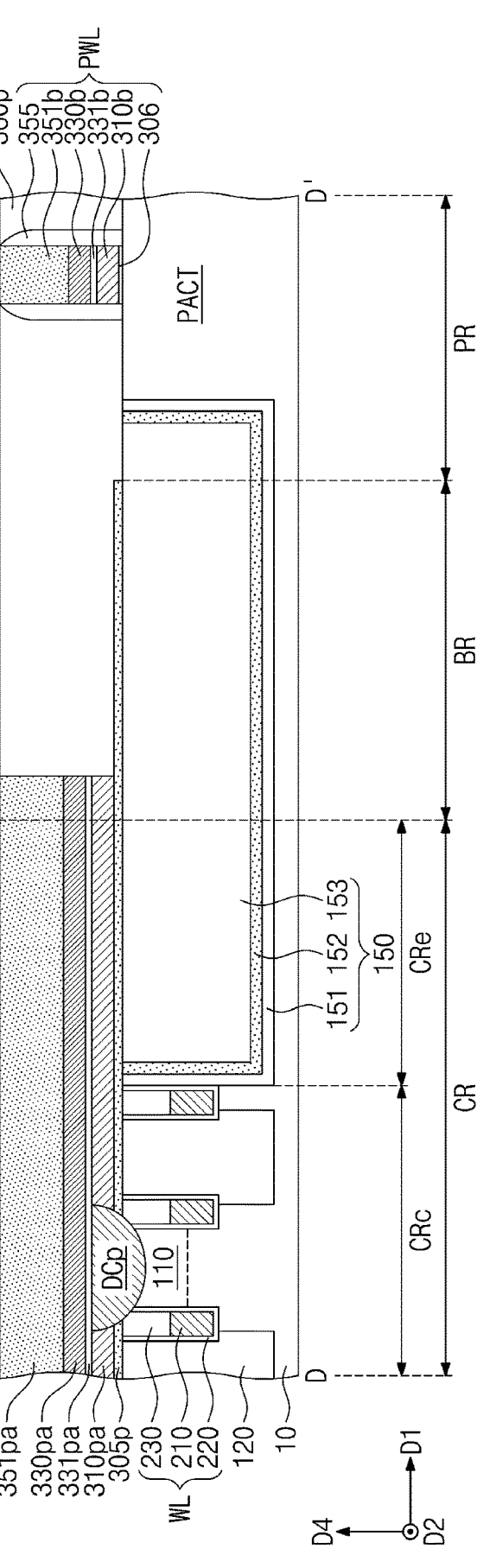
FIGS. 11, 16, 21, 26, and 31 are sectional views taken along lines D-D' of FIGS. 7, 12, 17, 22, and 27, respectively.
Figure 12:
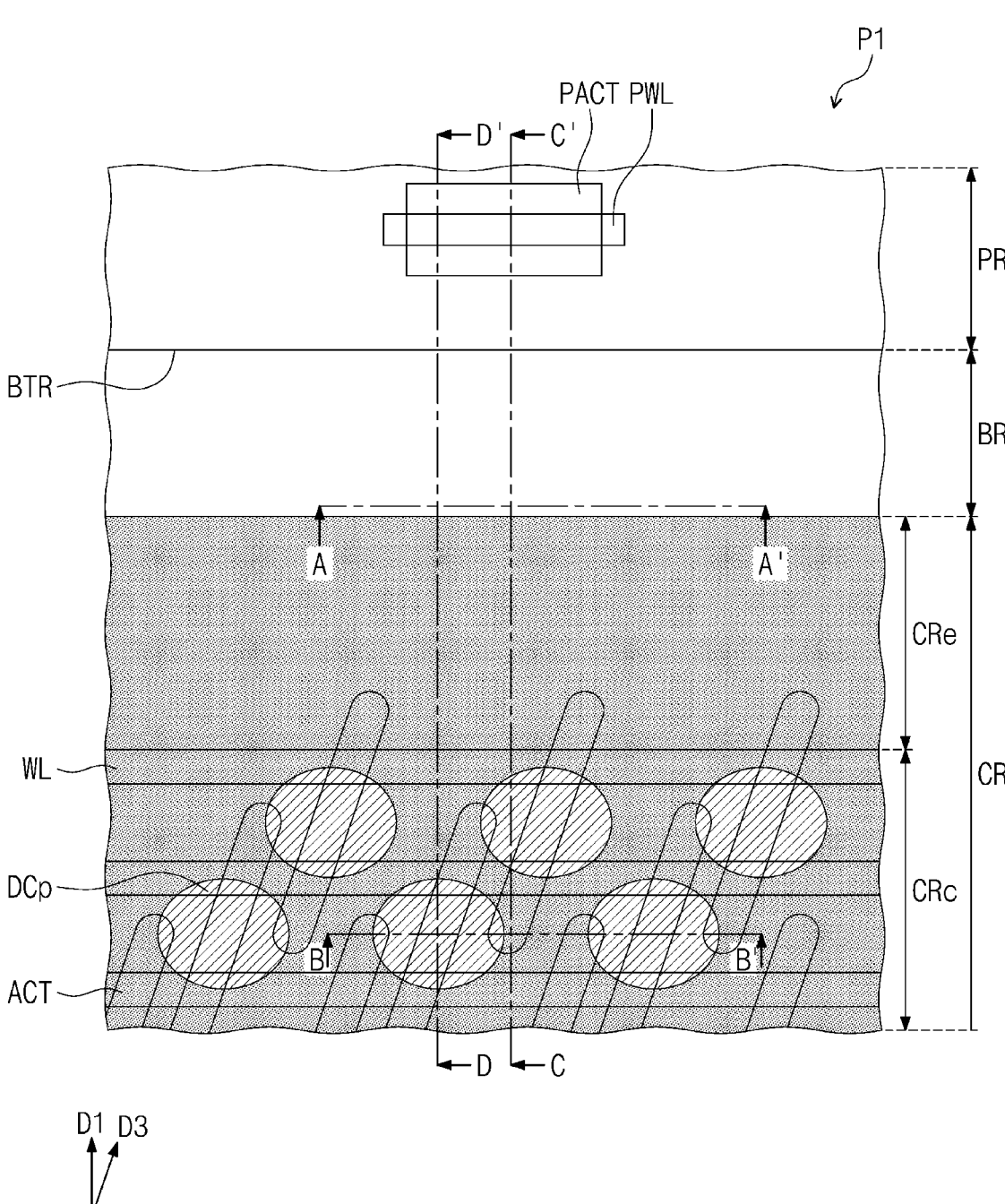
Figure 13:
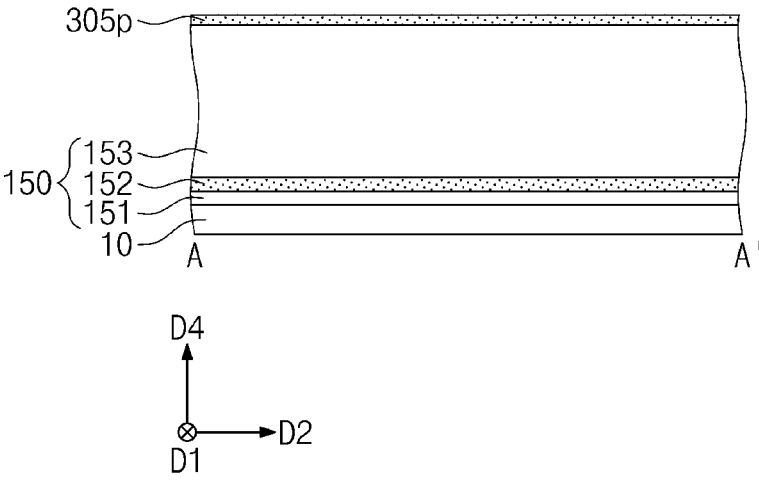
Figure 14:
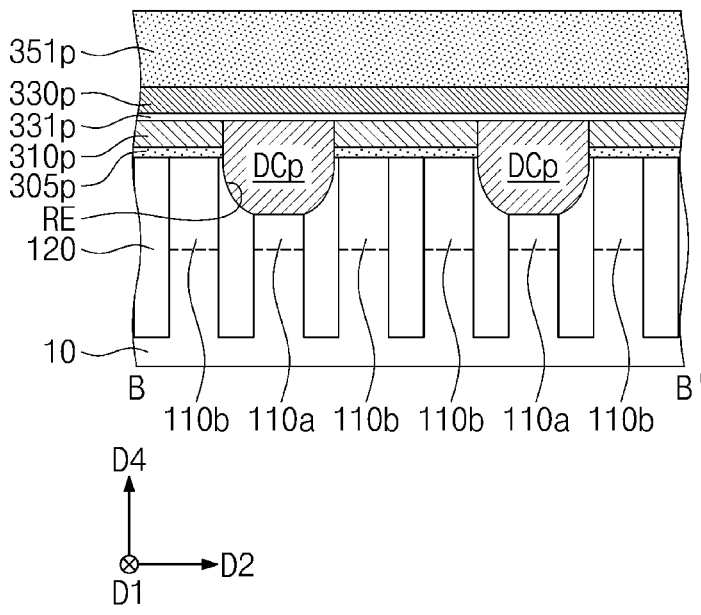
Figure 15:
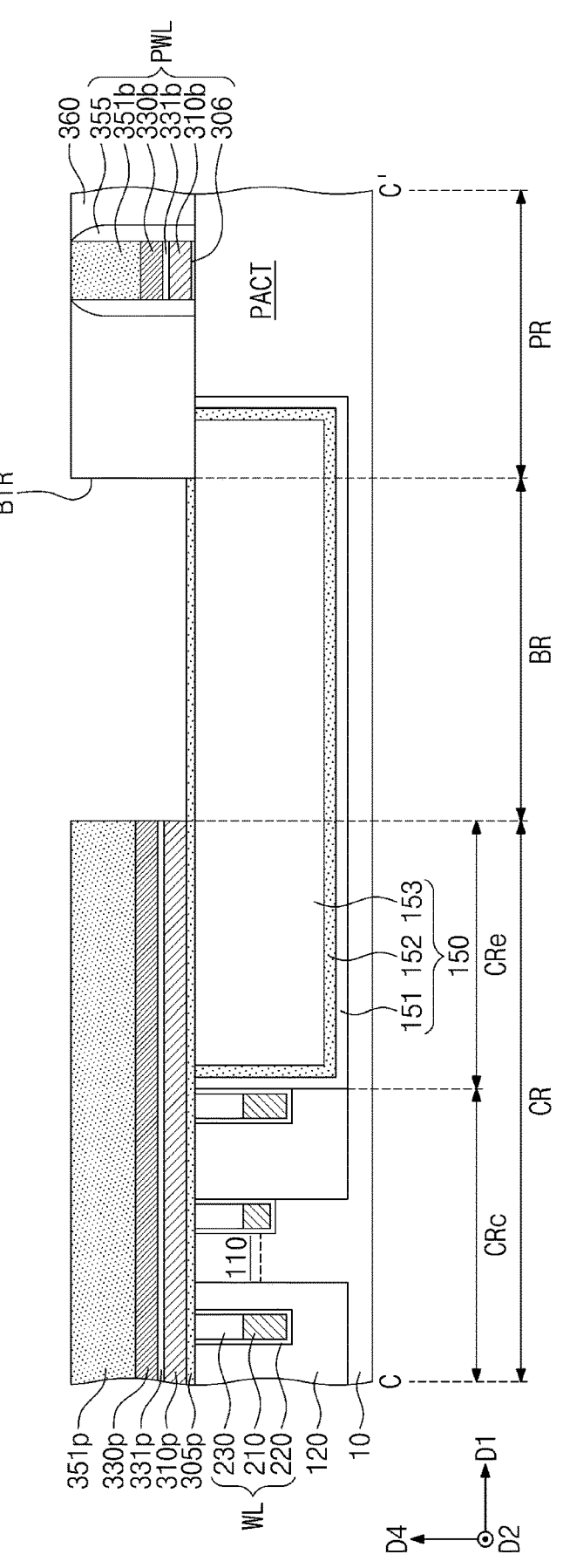
Figure 16:
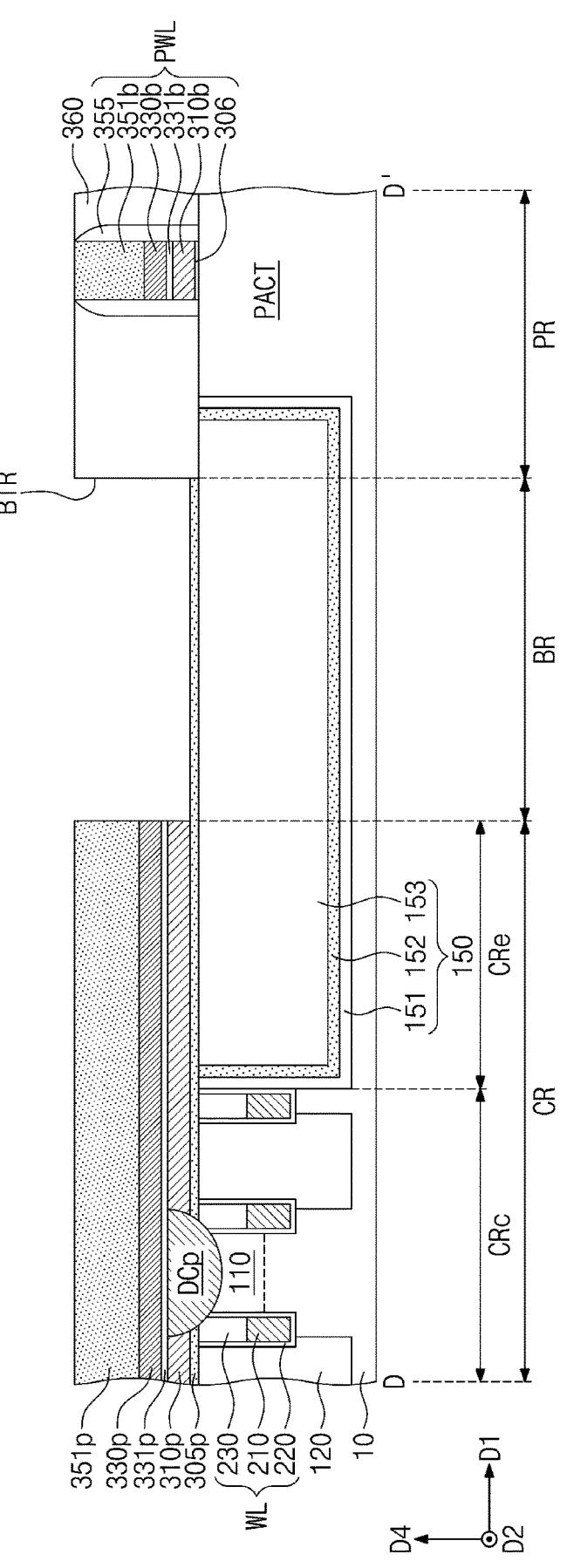
Figure 17:
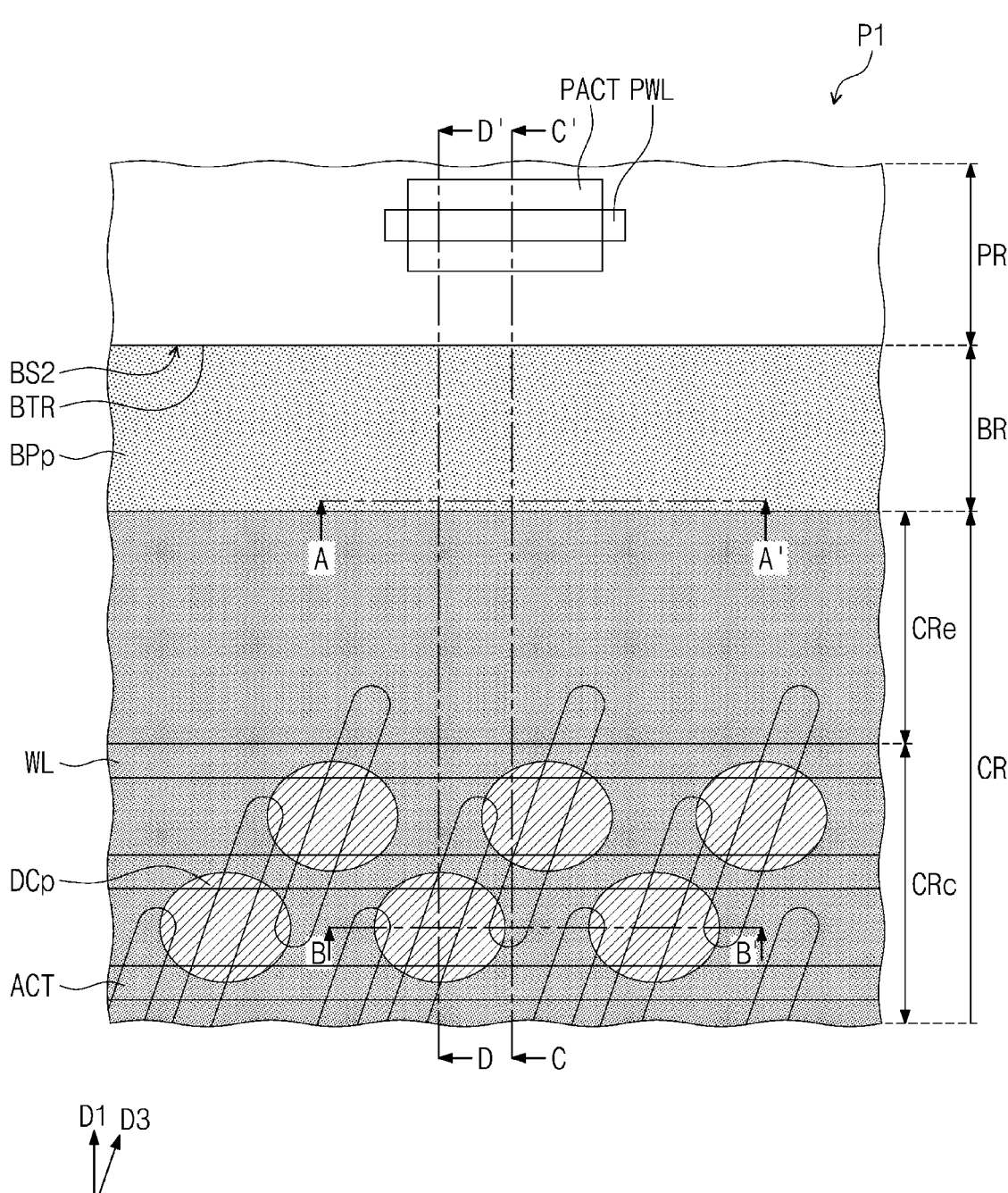
Figure 18:
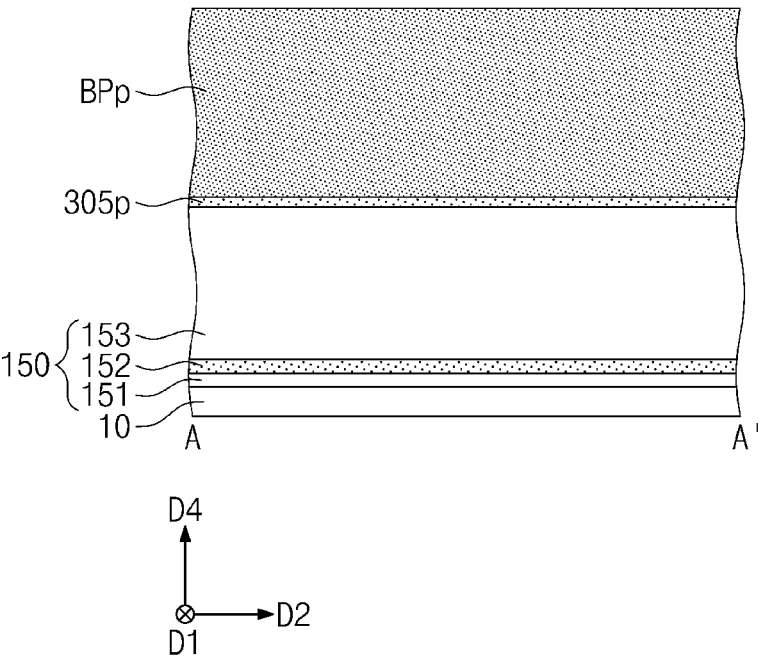
Figure 19:
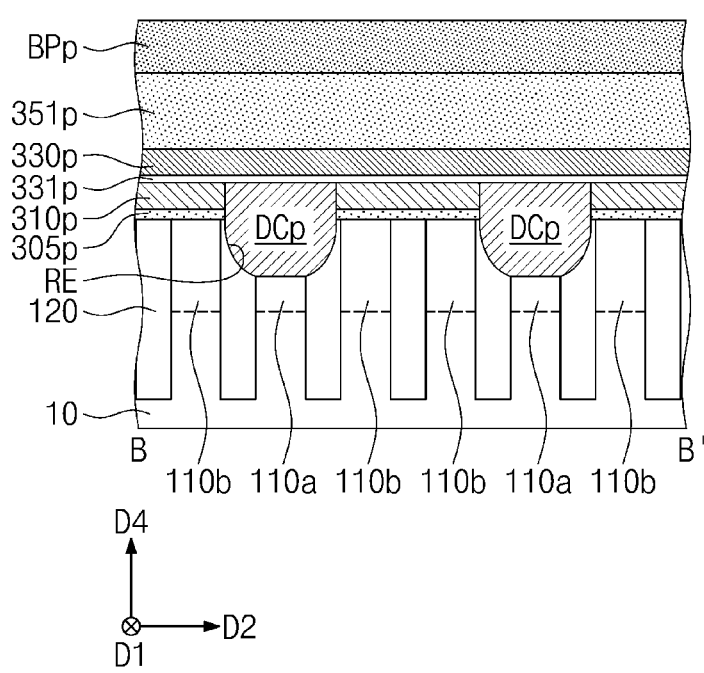
Figure 20:
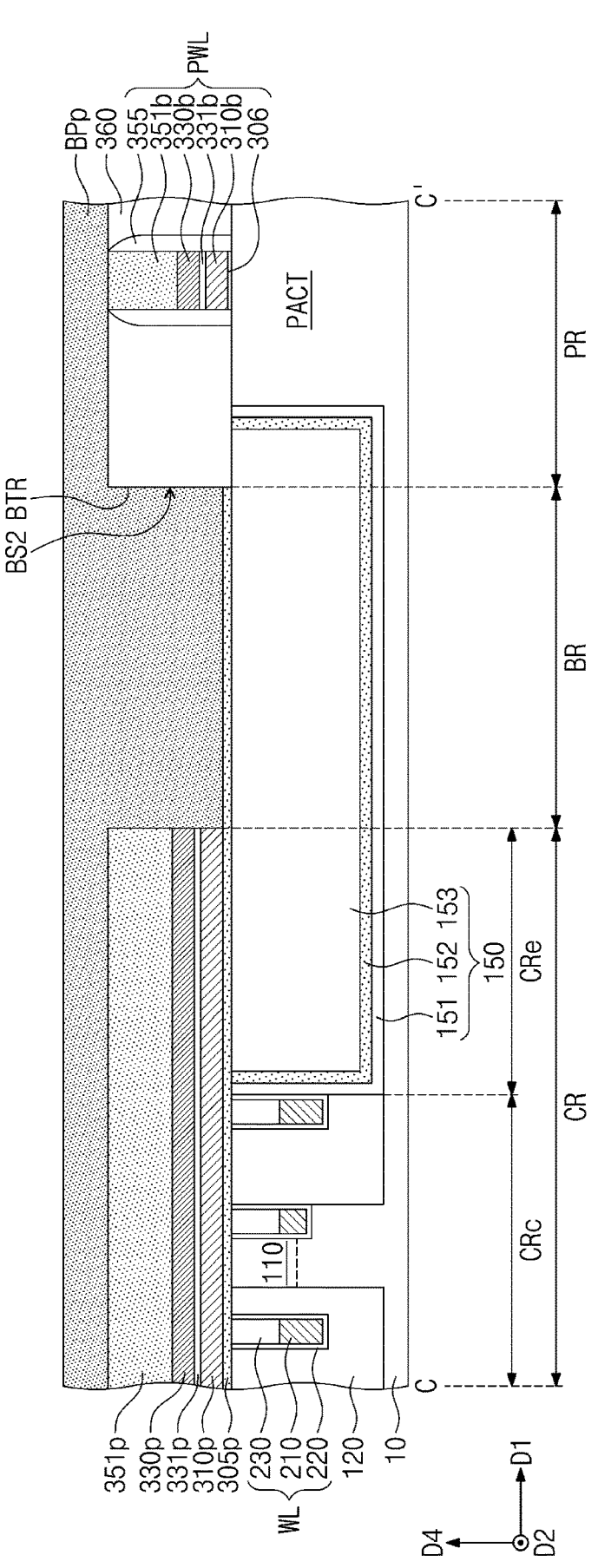
Figure 21:
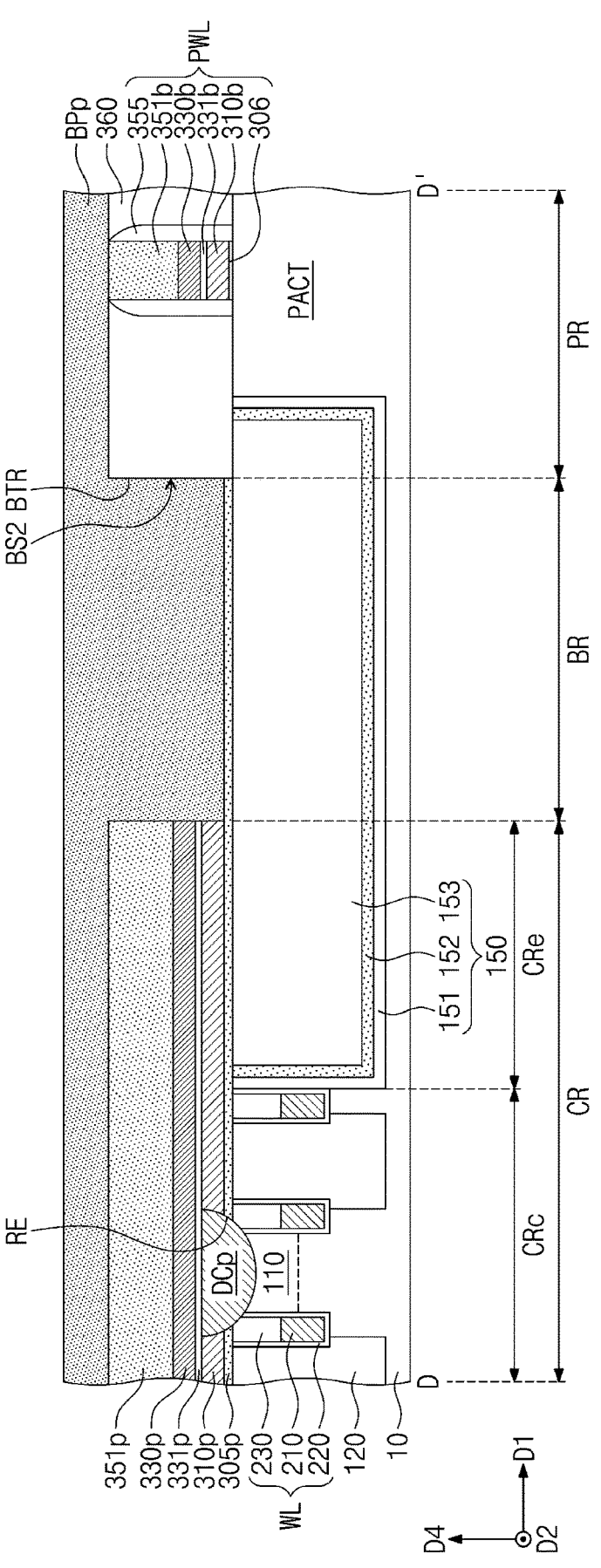
Figure 22:
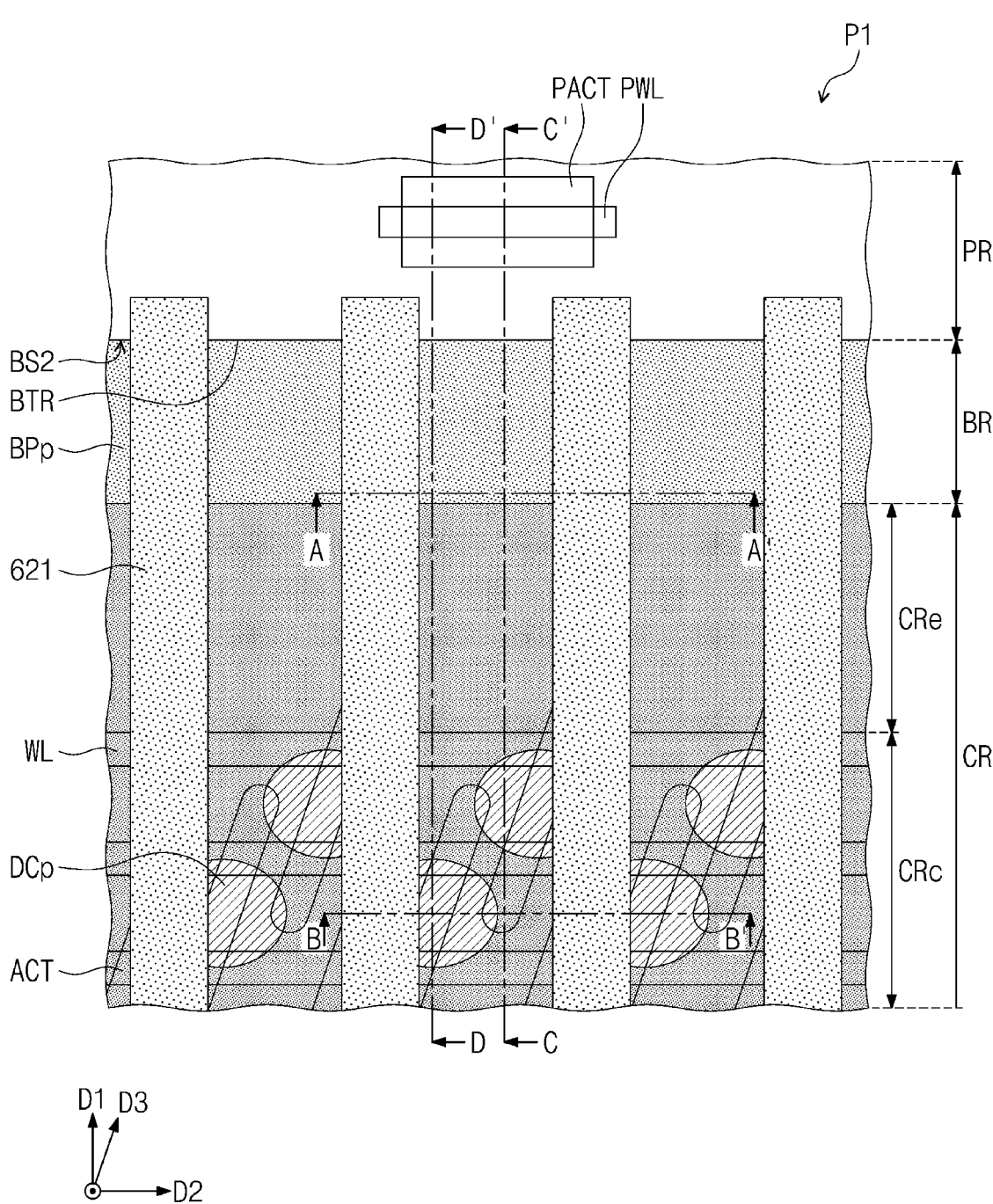
Figure 23:
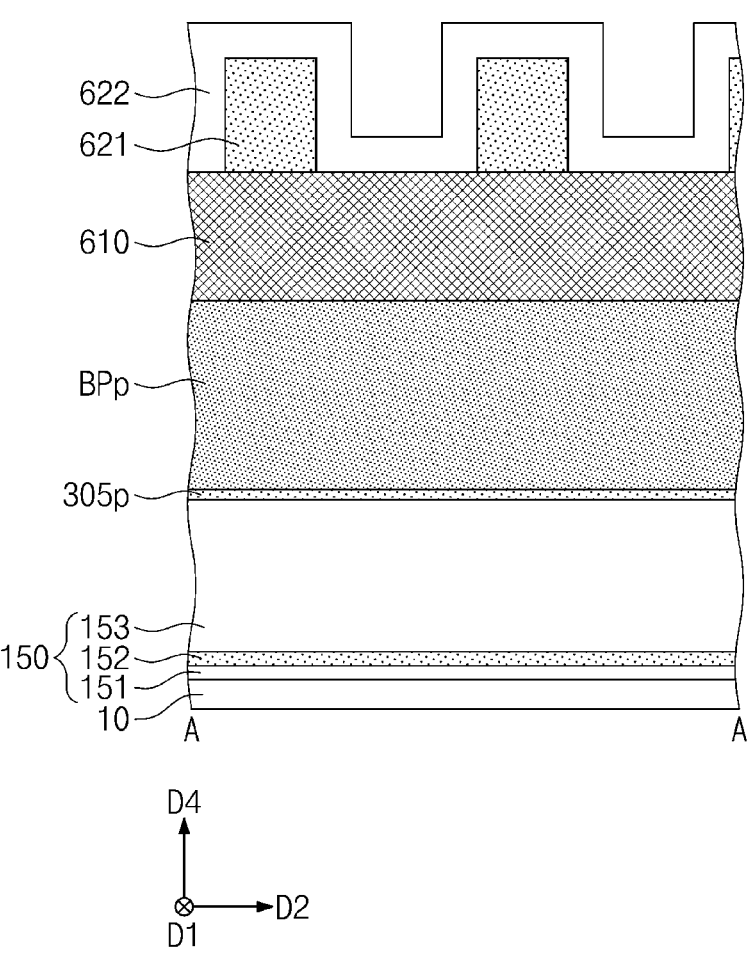
Figure 24:
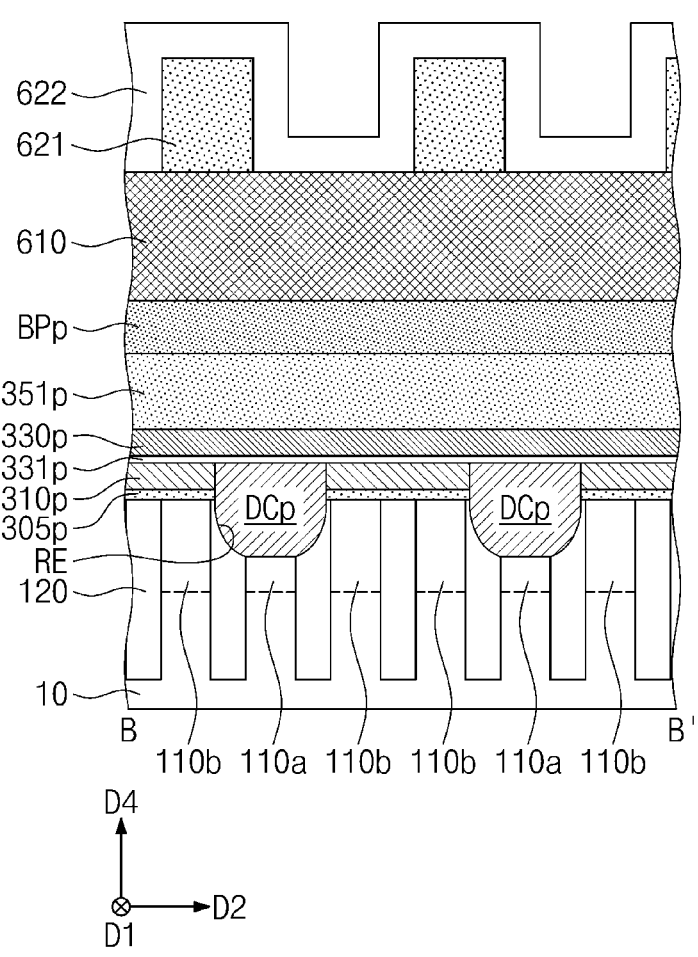
Figure 25:
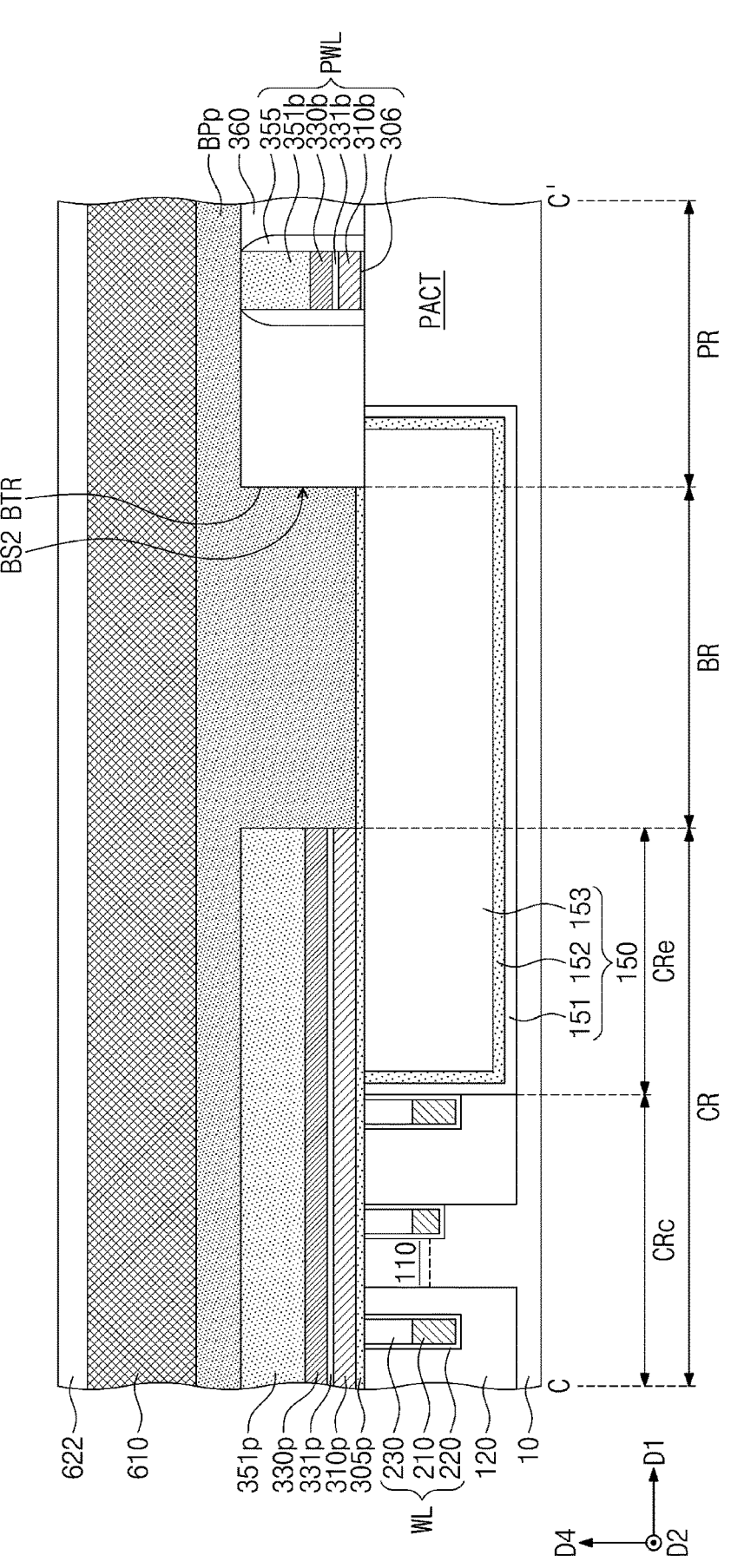
Figure 26:
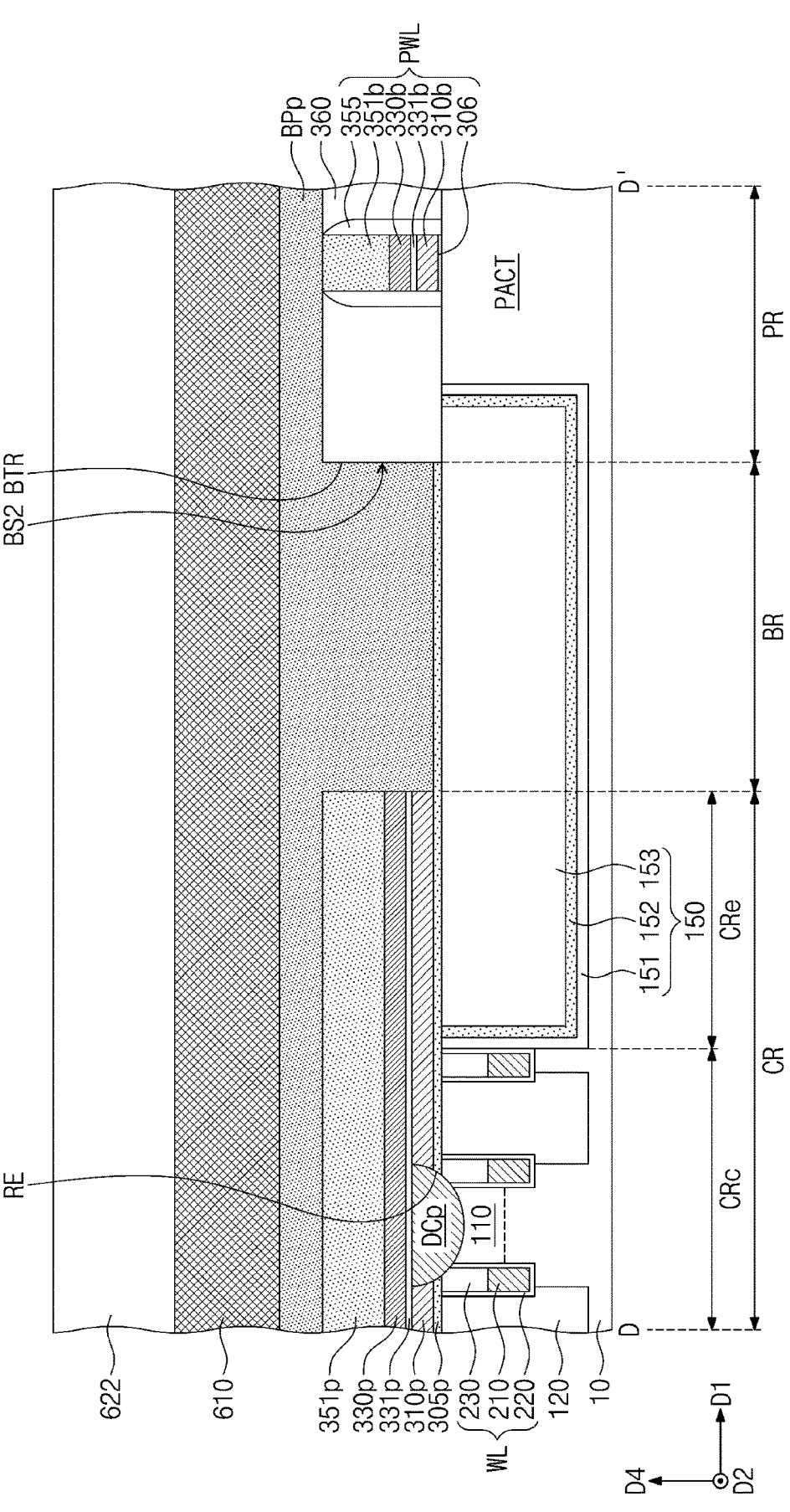
Figure 27:
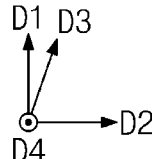
Figure 28:
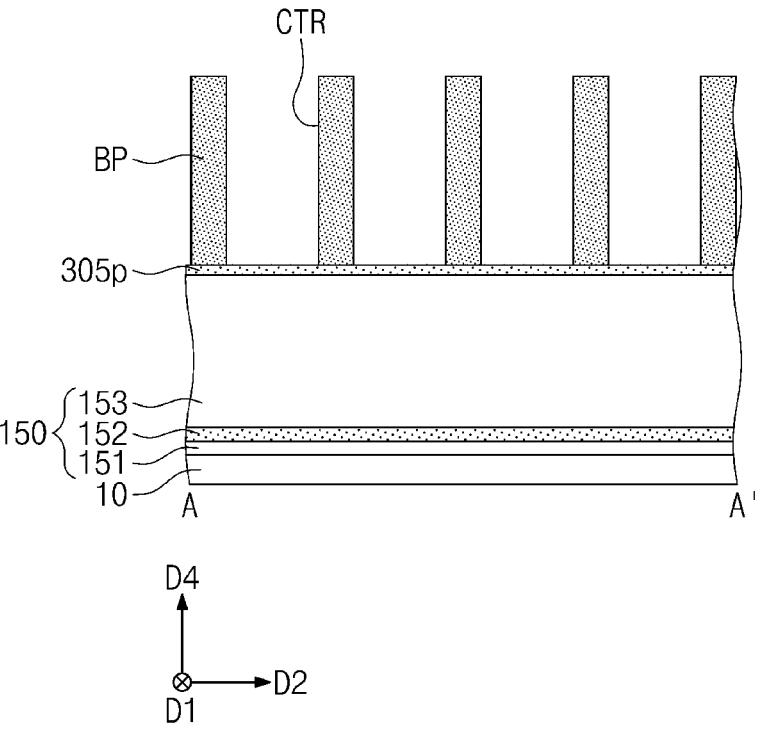
Figure 29:
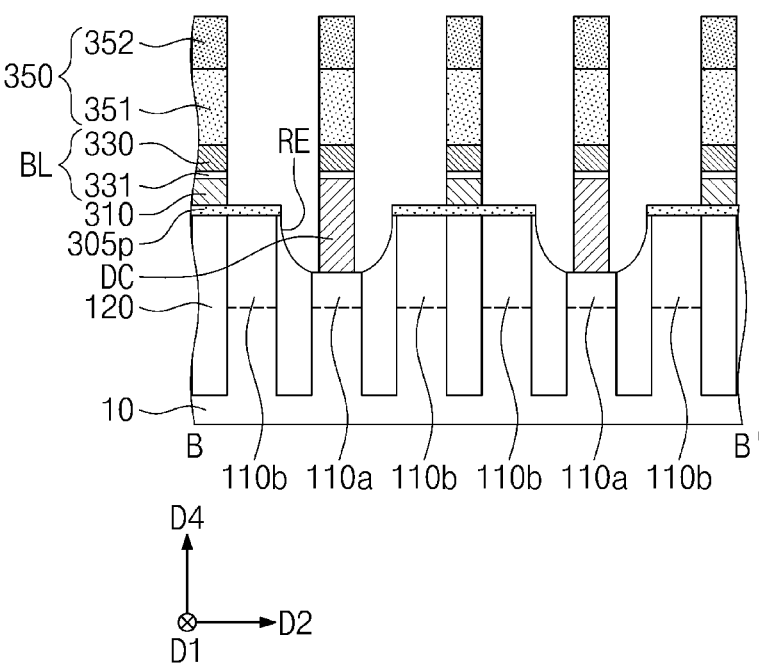
Figure 30:
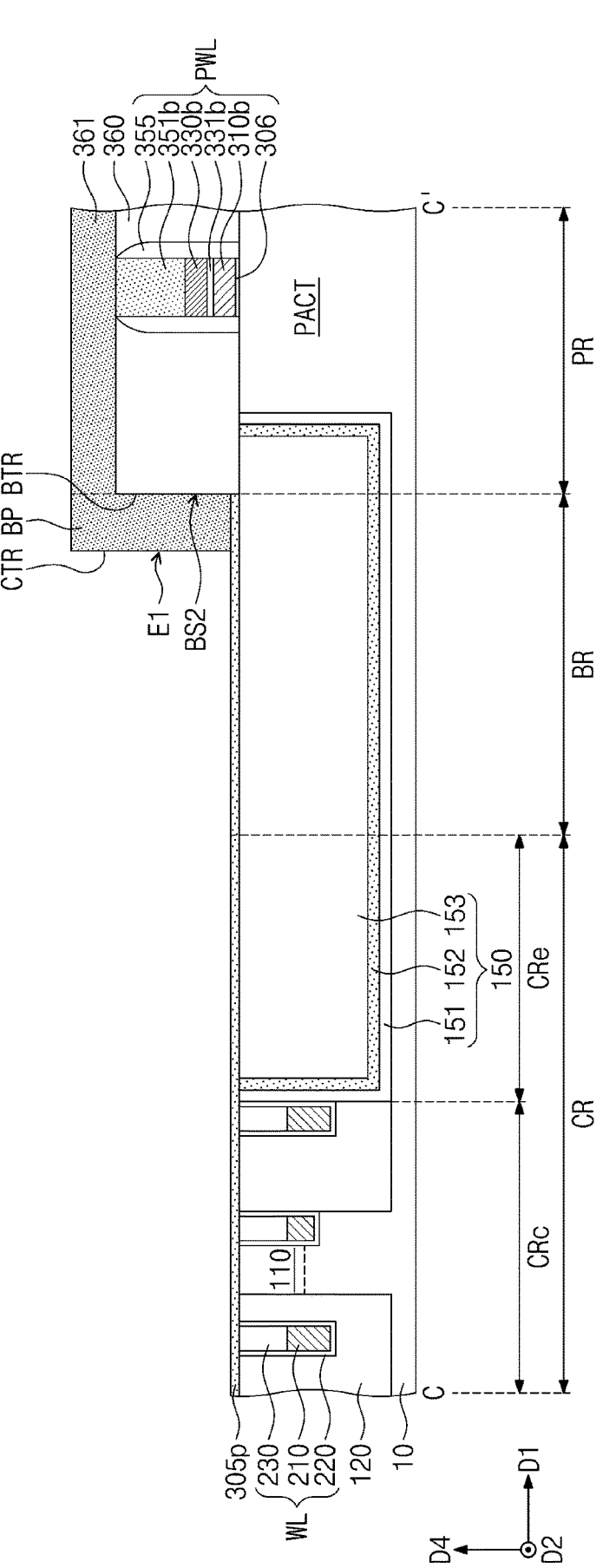
Figure 31:
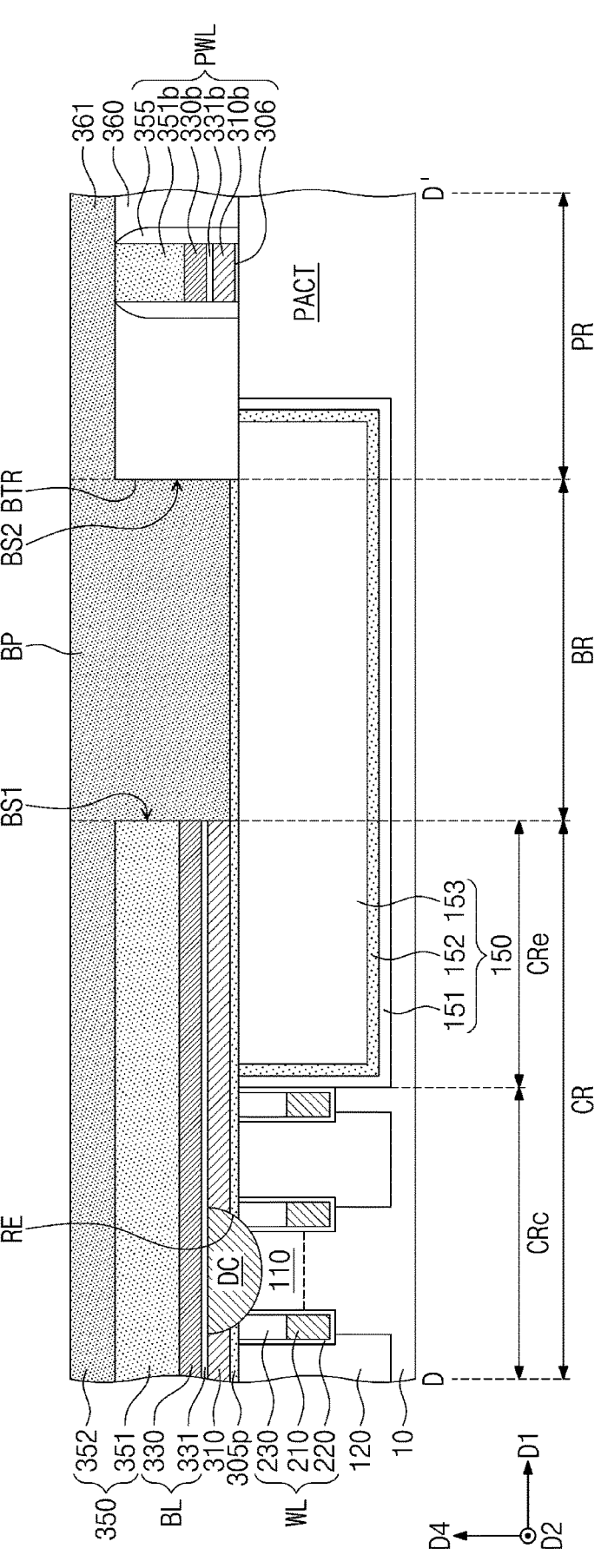

FIG. 2 is a plan view illustrating a portion (e.g., a portion 'P1' of FIG. 1) of a semiconductor device according to an embodiment of the inventive concept. FIGS. 3 to 6 are sectional views taken along lines A-A', B-B', C-C', D-D' of FIG. 2, respectively.

Referring to FIGS. 2 to 6, a substrate 10 may be provided. The substrate 10 may be a semiconductor substrate (e.g., a silicon substrate, a germanium substrate, or a silicon-germanium substrate). The substrate 10 may include a cell region CR, a peripheral region PR, and a boundary region BR between the cell region and the peripheral region. The cell region CR may include a central cell region CRc and an edge cell region CRe, which is provided between the central cell region CRc and the boundary region BR.

The cell region CR may be a region of the substrate 10, on which each cell block CB of FIG. 1 is provided, and the peripheral region PR may be another region of the substrate 10, on which the peripheral block PB of FIG. 1 is provided. The boundary region BR may be another region of the substrate 10, which is interposed between the cell region CR and the peripheral region PR. The cell region CR, the boundary region BR, and the peripheral region PR may be arranged in a first direction D1 parallel to a top surface of the substrate 10. The boundary region BR may be extended in a second direction D2, which is parallel to the top surface of the substrate 10 and is not parallel to the first direction D1.

Cell active patterns ACT may be disposed on the cell region CR of the substrate 10. The cell active patterns ACT may be spaced apart from each other in the first and second directions D1 and D2. The cell active patterns ACT may be bar-shaped patterns extended in a third direction D3, which is parallel to the top surface of the substrate 10 and is not parallel to the first and second directions D1 and D2. An end portion of one of the cell active patterns ACT may be placed adjacent to a center of another of the cell active patterns ACT adjacent thereto in the second direction D2. Each of the cell active patterns ACT may be a protruding portion of the substrate 10 which is extended in a fourth direction D4 perpendicular to the top surface of the substrate 10.

Device isolation layers 120 may be disposed between the cell active patterns ACT on the cell region CR. The device isolation layers 120 may be disposed in/on the substrate 10 to define the cell active patterns ACT. The device isolation layers 120 may be formed of or include at least one of, for example, silicon oxide, silicon nitride, and/or silicon oxynitride.

Word lines WL may be provided on the cell region CR to cross the cell active patterns ACT and the device isolation layers 120. The word lines WL may be disposed in grooves, which are formed in the cell active patterns ACT and the device isolation layers 120. The word lines WL may be extended in the second direction D2 and may be spaced apart from each other in the first direction D1. The word lines WL may be buried in the substrate 10.

Each of the word lines WL may include a cell gate electrode 210, a cell gate dielectric pattern 220, and a cell gate capping pattern 230. The cell gate electrode 210 may be provided to penetrate upper portions of the cell active patterns ACT and the device isolation layers 120. The cell gate dielectric pattern 220 may be interposed between the cell gate electrode 210 and the cell active patterns ACT and between the cell gate electrode 210 and the device isolation layers 120. The cell gate capping pattern 230 may be provided on the cell gate electrode 210. A top surface of the cell gate capping pattern 230 may be coplanar with top surfaces of the cell active patterns ACT.

The cell gate electrode 210 may be formed of or include a conductive material. In an embodiment, the conductive material may be one of doped semiconductor materials (e.g., doped silicon or doped germanium), conductive metal nitrides (e.g., titanium nitride or tantalum nitride), metallic materials (e.g., tungsten, titanium, or tantalum), and metal-semiconductor compounds (e.g., tungsten silicide, cobalt silicide, or titanium silicide). The cell gate dielectric pattern 220 may be formed of or include at least one of silicon oxide, silicon nitride, and/or silicon oxynitride. The cell gate capping pattern 230 may be formed of or include at least one of silicon oxide, silicon nitride, and/or silicon oxynitride.

Impurity regions 110 may be provided in the cell active patterns ACT. The impurity regions 110 may include first impurity regions 110a and second impurity regions 110b. The first impurity regions 110a may be provided between a pair of the word lines WL, which are provided to cross each of the cell active patterns ACT. The second impurity regions 110b may be provided in opposite edge regions of each of the cell active patterns ACT. The first impurity regions 110a and the second impurity regions 110b may be doped regions of the same conductivity type (e.g., n-type).

Peripheral active patterns PACT may be disposed on the peripheral region PR of the substrate 10. Although not shown, peripheral device isolation layers may be disposed between the peripheral active patterns PACT on the peripheral region PR. The peripheral device isolation layers may be disposed in/on the substrate 10 to define the peripheral active patterns PACT. Peripheral impurity regions may be provided in the peripheral active patterns PACT.

A boundary insulating pattern 150 may be disposed in/on the substrate 10 and on the cell region CR, the boundary region BR, and the peripheral region PR. The boundary insulating pattern 150 may be provided on the edge cell region CRe of the cell region CR. The boundary insulating pattern 150 may include a first boundary insulating pattern 151, a second boundary insulating pattern 152, and a third boundary insulating pattern 153, which are sequentially stacked. The boundary insulating pattern 150 may be formed of or include at least one of, for example, silicon oxide, silicon nitride, and/or silicon oxynitride.

A buffer pattern 305 may be disposed on the cell region CR and the boundary region BR of the substrate 10. The buffer pattern 305 may cover the cell active patterns ACT, the device isolation layers 120, and the word lines WL. The buffer pattern 305 may be formed of or include at least one of, for example, silicon oxide, silicon nitride, and/or silicon oxynitride.

Bit lines BL may be disposed on the cell region CR. The bit lines BL may be extended in the first direction D1 and may be spaced apart from each other in the second direction D2. End portions of the bit lines BL may be placed at a boundary between the cell region CR and the boundary region BR. The bit lines BL may not be provided on the boundary region BR. Each of the bit lines BL may include a first ohmic pattern 331 and a metal-containing pattern 330, which are sequentially stacked. In an embodiment, the first ohmic pattern 331 may be formed of or include at least one of metal silicide materials. For example, the metal-containing pattern 330 may be formed of or include at least one of metallic materials (e.g., tungsten, titanium, and tantalum). Polysilicon patterns 310 may be interposed between the bit lines BL and the buffer pattern 305.

A width CDc of the bit lines BL on the central cell region CRc may be substantially equal to a width CDe of the bit lines BL on the edge cell region CRe.

Bit line capping patterns 350 may be disposed on the bit lines BL, respectively. Each of the bit line capping patterns 350 may include a lower capping pattern 351 and an upper capping pattern 352. The bit line capping patterns 350 may be extended in the first direction D1 on the bit lines BL and may be spaced apart from each other in the second direction D2.

Side surfaces of the polysilicon patterns 310, the bit lines BL, and the bit line capping patterns 350 may be covered with bit line spacers SP. Each of the bit line spacers SP may include a first sub-spacer 321 and a second sub-spacer 325, which are spaced apart from each other by an air gap AG. The first sub-spacer 321 and the second sub-spacer 325 may be formed of or include at least one of silicon nitride, silicon oxide, or silicon oxynitride and may have a single- or multi-layered structure. The first sub-spacer 321 and the second sub-spacer 325 may be formed of or include the same material. The phrase "air gap" will be understood to include gaps (e.g., pockets) of air or gases other than air, such as other atmospheric gases or chamber gases that may be present during manufacturing. An "air gap" may also constitute a space having no or substantially no gas or other material therein.

Bit line contacts DC may be respectively interposed between the bit lines BL and the first impurity regions 110a. The bit lines BL may be electrically connected to the first impurity regions 110a through the bit line contacts DC. The bit line contacts DC may be formed of or include doped or undoped polysilicon.

The bit line contacts DC may be disposed in recess regions RE, respectively. The recess region RE may be provided in an upper portion of the first impurity region 110a and upper portions of the device isolation layers 120 adjacent thereto. The first sub-spacer 321 and a gapfill insulating pattern 315 may be provided to fill a remaining portion of the recess region RE.

Cell trenches CTR may be provided between the bit lines BL. The cell trenches CTR may be extended from the cell region CR to the boundary region BR in the first direction D1 and may be spaced apart from each other in the second direction D2.

Peripheral word lines PWL may be disposed on the peripheral region PR of the substrate 10. The peripheral word lines PWL may cross the peripheral active patterns PACT. Each of the peripheral word lines PWL may include a peripheral polysilicon pattern 310b, a peripheral first ohmic pattern 331b, a peripheral metal-containing pattern 330b, a peripheral capping pattern 351b, a peripheral gate dielectric pattern 306, and a peripheral spacer 355. The peripheral polysilicon pattern 310b, the peripheral first ohmic pattern 331b, the peripheral metal-containing pattern 330b, and the peripheral capping pattern 351b may be formed of or include the same materials as the polysilicon pattern 310, the first ohmic pattern 331, the metal-containing pattern 330, and the lower capping pattern 351, respectively, and may cross the peripheral active pattern PACT. The peripheral gate dielectric pattern 306 may be interposed between the substrate 10 and the peripheral polysilicon pattern 310b. The peripheral spacer 355 may be provided on side surfaces of the peripheral polysilicon pattern 310b, the peripheral first ohmic pattern 331b, the peripheral metal-containing pattern 330b, the peripheral capping pattern 351b, and the peripheral gate dielectric pattern 306.

A first peripheral insulating pattern 360 and a second peripheral insulating pattern 361 may be disposed on the peripheral region PR. The first peripheral insulating pattern 360 and the second peripheral insulating pattern 361 may cover the peripheral word lines PWL. In an embodiment, the first peripheral insulating pattern 360 may cover the peripheral word lines PWL on the peripheral spacer 355, and the second peripheral insulating pattern 361 may cover the first peripheral insulating pattern 360. The first peripheral insulating pattern 360 may be formed of or include silicon oxide.

A boundary pattern BP may be provided on the boundary region BR of the substrate 10. The boundary pattern BP may be provided in a boundary trench BTR on the boundary region BR. The boundary trench BTR may be provided on the buffer pattern 305. For example, the boundary pattern BP may be provided on the buffer pattern 305. The boundary pattern BP may be provided on the boundary insulating pattern 150.

An inner side surface of the boundary trench BTR may be placed on a boundary between the cell region CR and the boundary region BR. An opposite inner side surface of the boundary trench BTR may be placed on a boundary between the peripheral region PR and the boundary region BR. The boundary pattern BP may have a first interface BS1 corresponding to the inner side surface of the boundary trench BTR and may have a second interface BS2 corresponding to the opposite inner side surface of the boundary trench BTR. The first interface BS1 of the boundary pattern BP may be located at a boundary between the cell region CR and the boundary region BR. The second interface BS2 of the boundary pattern BP may be located at a boundary between the peripheral region PR and the boundary region BR. The boundary pattern BP may include silicon nitride. In an embodiment, the boundary pattern BP may be formed of silicon nitride.

End portions of the bit lines BL may be extended in the first direction D1 and may be in contact with the first interface BS1 of the boundary pattern BP. The first interface BS1 of the boundary pattern BP may include silicon nitride. In an embodiment, the first interface BS1 may be formed of silicon nitride. For example, the end portions of the bit lines BL may be in contact with the silicon nitride. The first interface BS1 may not include silicon oxide. For example, the end portions of the bit lines BL may not be in contact with the silicon oxide.

The first peripheral insulating pattern 360 may be in contact with the second interface BS2 of the boundary pattern BP. The second peripheral insulating pattern 361 may be formed of or include the same material as the boundary pattern BP. In an embodiment, the boundary pattern BP may be formed of or include silicon nitride, and here, the second peripheral insulating pattern 361 may be formed of or include silicon nitride.

The bit line capping patterns 350 may be formed of or include the same material as the boundary pattern BP. The upper capping pattern 352 of the bit line capping patterns 350 may be formed of or include the same material as the boundary pattern BP. In an embodiment, the boundary pattern BP may be formed of silicon nitride, and here the upper capping pattern 352 may be formed of or include silicon nitride.

First end portions E1 of the cell trenches CTR may be extended into the boundary pattern BP. The first end portions E1 of the cell trenches CTR may be placed on the boundary region BR. The first end portions E1 of the cell trenches CTR may be arranged to form a zigzag shape in the second direction D2. In an embodiment, some of the first end portions E1 may be arranged to be close to the second interface BS2, compared to others of the first end portions E1 that are placed near them. For example, even-numbered ones of the first end portions E1 may be closer to the second interface BS2 than odd-numbered ones of the first end portions E1. The first end portions E1 of the cell trenches CTR may be closer to the peripheral region PR than the end portions of the bit lines BL.

A portion of the boundary pattern BP may form at least a portion of an inner side surface of the cell trench CTR, on the boundary region BR. The portion of the boundary pattern BP may include silicon nitride. For example, the portion of the boundary pattern BP may be formed of silicon nitride. The portion of the boundary pattern BP may not include silicon oxide.

The inner side surface of each of the cell trenches CTR may be covered with the bit line spacer SP. A gap-fill pattern 380 may be provided to fill an inner space of the cell trench CTR covered with the bit line spacer SP. The gap-fill pattern 380 may be formed of or include silicon nitride.

Storage node contacts BC may be disposed between the bit lines BL. The bit line spacer SP may be interposed between the storage node contacts BC and the bit lines BL adjacent thereto. The storage node contacts BC may be spaced apart from each other in the first and second directions D1 and D2. The storage node contacts BC may be formed of or include doped or undoped polysilicon. The gap-fill pattern 380 may be provided between the storage node contacts BC which are adjacent to each other in the first direction D1.

A second ohmic pattern 341 may be disposed on each of the storage node contacts BC. The second ohmic pattern 341 may be formed of or include at least one of metal silicide materials. A diffusion prevention pattern 342 may confor- mally cover the first sub-spacer 321, the second sub-spacer 325, and the bit line capping pattern 350. The diffusion prevention pattern 342 may be formed of or include at least one of metal nitrides (e.g., titanium nitride and tantalum nitride). Landing pads LP may be disposed on the diffusion prevention patterns 342, respectively. The landing pads LP may be formed of or include a metal-containing material (e.g., tungsten). In the second direction D2, an upper portion of the landing pad LP may have a width larger than the storage node contact BC. The upper portion of the landing pad LP may be shifted from the storage node contact BC in the second direction D2. For example, at least a portion of the upper portion of the landing pad LP may not overlap the storage node contact BC in the fourth direction D4. The landing pads LP may be spaced apart from each other in the first and second directions D1 and D2.

A first interlayer insulating pattern 400 may be provided between the adjacent ones of the landing pads LP. The first interlayer insulating pattern 400 may be in contact with an upper portion of the bit line capping pattern 350, an upper portion of the bit line spacer SP, side surfaces of the landing pads LP, and the diffusion prevention pattern 342, which is not covered with the landing pad LP. The first interlayer insulating pattern 400 may be extended to the boundary region BR and the peripheral region PR. The first interlayer insulating pattern 400 may be provided on the gap-fill pattern 380 on the boundary region BR and on the second peripheral insulating pattern 361 on the peripheral region PR. As an example, the first interlayer insulating pattern 400 may be formed of or include at least one of silicon oxide, silicon nitride, and/or silicon oxynitride. As another example, the first interlayer insulating pattern 400 may further include a space, which is connected to the air gap AG of the bit line spacer SP and is filled with the air.

Bit line contact plugs DCBL may be provided to sequen- tially penetrate the first interlayer insulating pattern 400, the bit line capping pattern 350, and the metal-containing pat- tern 330. The bit line contact plugs DCBL may be electri- cally connected to the bit lines BL, respectively. A width of an upper portion of the bit line contact plug DCBL, which is surrounded by the first interlayer insulating pattern 400, may be larger than a width of a lower portion of the bit line contact plug DCBL, which is surrounded by the bit line capping pattern 350 and the metal-containing pattern 330. A bottom surface of the upper portion of the bit line contact plugs DCBL may be in contact with the diffusion prevention pattern 342. The bit line contact plugs DCBL may be formed of or include the same material as the landing pads LP. As an example, the bit line contact plugs DCBL may be formed of or include a metal-containing material (e.g., tungsten).

Peripheral contact plugs DCCP may be disposed at both sides of each of the peripheral word lines PWL. Each of the peripheral contact plugs DCCP may be provided to sequen- tially penetrate the first interlayer insulating pattern 400, the second peripheral insulating pattern 361, and the first peripheral insulating pattern 360. A width of an upper portion of the peripheral contact plug DCCP, which is surrounded by the first interlayer insulating pattern 400, may be larger than a width of a lower portion of the peripheral contact plug DCCP, which is surrounded by the second peripheral insulating pattern 361 and the first peripheral insulating pattern 360. A bottom surface of the upper portion of the peripheral contact plugs DCCP may be in contact with the diffusion prevention pattern 342. The peripheral contact plugs DCCP may be formed of or include the same material as the landing pads LP. As an example, the peripheral contact plugs DCCP may be formed of or include a metal-containing material (e.g., tungsten).

Bottom electrodes BE may be disposed on the landing pads LP, respectively. The bottom electrodes BE may be formed of or include at least one of doped poly-silicon, metal nitrides (e.g., titanium nitride), or metals (e.g., tung- sten, aluminum, and copper). Each of the bottom electrodes BE may have a circular pillar shape, a hollow cylinder shape, or a cup shape. An upper supporting pattern SS1 may be provided to support upper side surfaces of the bottom electrodes BE, and a lower supporting pattern SS2 may be provided to support lower side surfaces of the bottom electrodes BE. The upper and lower supporting patterns SS1 and SS2 may be formed of or include at least one of insulating materials (e.g., silicon nitride, silicon oxide, and silicon oxynitride).

An etch stop layer 420 may be provided on the cell region CR, the boundary region BR, and the peripheral region PR. The etch stop layer 420 may be provided between the bottom electrodes BE and on the first interlayer insulating pattern 400. The etch stop layer 420 may be formed of or include at least one of insulating materials (e.g., silicon nitride, silicon oxide, and silicon oxynitride). A dielectric layer DL may be provided to cover surfaces of the bottom electrodes BE and surfaces of the upper and lower supporting patterns SS1 and SS2. The dielectric layer DL may be formed of or include at least one of silicon oxide, silicon nitride, silicon oxynitride, and high-k dielectric materials (e.g., hafnium oxide). A top electrode TE may be disposed on the dielectric layer DL to fill a space between the bottom electrodes BE. The top electrode TE may be formed of or include at least one of doped poly-silicon, doped silicon germanium, metal nitrides (e.g., titanium nitride), or metallic materials (e.g., tungsten, aluminum, and copper). The bottom electrodes BE, the dielectric layer DL, and the top electrode TE may constitute a capacitor CA.

A second interlayer insulating pattern 500 may be provided on the etch stop layer 420 and on the cell region CR, the boundary region BR, and the peripheral region PR. The second interlayer insulating pattern 500 may cover a side surface of the capacitor CA. The second interlayer insulating pattern 500 may be formed of or include at least one of silicon oxide, silicon nitride, and/or silicon oxynitride.

Metal contacts MC may be provided to penetrate the second interlayer insulating pattern 500 and to be in contact with the bit line contact plugs DCBL and the peripheral contact plugs DCCP, respectively. The metal contacts MC may be electrically connected to the bit line contact plugs DCBL and the peripheral contact plugs DCCP. The second interlayer insulating pattern 500 may be formed to cover side surfaces of the metal contacts MC. The metal contacts MC may be formed of or include at least one of conductive materials.

FIGS. 7, 12, 17, 22, and 27 are plan views illustrating a method of fabricating a semiconductor device according to an embodiment of the inventive concept and, in particular, to the portion 'P1' of FIG. 1. FIGS. 8, 13, 18, 23, and 28 are sectional views taken along lines A-A' of FIGS. 7, 12, 17, 22, and 27, respectively. FIGS. 9, 14, 19, 24, and 29 are sectional views taken along lines B-B' of FIGS. 7, 12, 17, 22, and 27, respectively. FIGS. 10, 15, 20, 25, and 30 are sectional views taken along lines C-C' of FIGS. 7, 12, 17, 22, and 27, respectively. FIGS. 11, 16, 21, 26, and 31 are sectional views taken along lines D-D' of FIGS. 7, 12, 17, 22, and 27, respectively. A method of fabricating a semiconductor device according to an embodiment of the inventive concept will be described in more detail below. For concise description, an element previously described with reference to FIGS. 1 to 6 may be identified by the same reference number without repeating an overlapping description thereof.

Referring to FIGS. 7 to 11, the substrate 10 including the cell region CR, the peripheral region PR, and the boundary region BR between the cell region and the peripheral region may be provided. The cell active patterns ACT and the device isolation layers 120 may be formed on the cell region CR and in/on the substrate 10. The cell active patterns ACT may be spaced apart from each other in the first and second directions D1 and D2. The cell active patterns ACT may be bar-shaped patterns extended in the third direction D3, which is parallel to the top surface of the substrate 10 and is not parallel to the first and second directions D1 and D2. The device isolation layers 120 may be disposed in/on the substrate 10 to define the cell active patterns ACT.

The boundary insulating pattern 150 may be formed on the cell region CR, the boundary region BR, and the peripheral region PR and in the substrate 10. The boundary insulating pattern 150 may be formed of or include at least one of, for example, silicon oxide, silicon nitride, and/or silicon oxynitride.

The word lines WL may be formed on the cell region CR to cross the cell active patterns ACT and the device isolation layers 120. The word lines WL may be extended in the second direction D2 and may be spaced apart from each other in the first direction D1. The word lines WL may be buried in the substrate 10.

The impurity regions 110 may be formed in the cell active patterns ACT and may include the first impurity regions 110a and the second impurity regions 110b. The first impurity regions 110a may be formed between a pair of the word lines WL which are formed to cross each of the cell active patterns ACT. The second impurity regions 110b may be formed in opposite edge regions of each of the cell active patterns ACT.

The recess regions RE may be formed in upper portions of the first impurity regions 110a and upper portions of the device isolation layers 120 adjacent thereto. The recess regions RE may be filled with preliminary bit line contacts DCp, respectively. A preliminary buffer pattern 305p, a poly-silicon layer 310pa, an ohmic layer 331pa, a metal-containing layer 330pa, and a lower capping layer 351pa may be sequentially stacked on the cell region CR and the boundary region BR. On the boundary region BR, an area provided with the preliminary buffer pattern 305p may be larger than an area provided with the poly-silicon layer 310pa, the ohmic layer 331pa, the metal-containing layer 330pa, and the lower capping layer 351pa. The preliminary buffer pattern 305p and the poly-silicon layer 310pa may be provided to cover a side surface of an upper portion of the preliminary bit line contact DCp. A portion of the preliminary buffer pattern 305p may be provided on the boundary region BR. The ohmic layer 331pa may be provided to cover top surfaces of the preliminary bit line contacts DCp.

The peripheral active patterns PACT and the peripheral word lines PWL may be formed on the peripheral region PR of the substrate 10. The preliminary first peripheral insulating pattern 360p may be formed on the peripheral region PR to cover the peripheral word lines PWL. A portion of the preliminary first peripheral insulating pattern 360p may be formed on the boundary region BR. On the boundary region BR, the portion of the preliminary first peripheral insulating pattern 360p may be disposed on the portion of the preliminary buffer pattern 305p. On the boundary region BR, the preliminary first peripheral insulating pattern 360p may be in contact with the poly-silicon layer 310pa, the ohmic layer 331pa, the metal-containing layer 330pa, and the lower capping layer 351pa.

Referring to FIGS. 12 to 16, the boundary trench BTR may be formed on the boundary region BR. The formation of the boundary trench BTR may include etching portions of the poly-silicon layer 310pa, the ohmic layer 331pa, the metal-containing layer 330pa, the lower capping layer 351pa, and the preliminary first peripheral insulating pattern 360p of FIG. 11, which are located on the boundary region BR. As a result of the formation of the boundary trench BTR, a preliminary polysilicon pattern 310p, a preliminary first ohmic pattern 331p, a preliminary metal-containing pattern 330p, a preliminary lower capping pattern 351p, and the first peripheral insulating pattern 360 may be formed.

A top surface of the preliminary buffer pattern 305p may be exposed through the boundary trench BTR. The boundary trench BTR may be formed to expose a side surface of each of the preliminary polysilicon pattern 310p, the preliminary first ohmic pattern 331p, the preliminary metal-containing pattern 330p, the preliminary lower capping pattern 351p, and the first peripheral insulating pattern 360.

Referring to FIGS. 17 to 21, a preliminary boundary pattern BPp may be formed. The preliminary boundary pattern BPp may be formed on the substrate 10 to fill the boundary trench BTR on the boundary region BR. The preliminary boundary pattern BPp may be formed on the cell region CR, the peripheral region PR, and the boundary region BR. The preliminary boundary pattern BPp may cover the preliminary lower capping pattern 351p on the cell region CR. The preliminary boundary pattern BPp may cover the first peripheral insulating pattern 360 on the peripheral region PR. The preliminary boundary pattern BPp may cover the preliminary buffer pattern 305p on the boundary region BR.

The preliminary boundary pattern BPp may be in contact with a side surface of each of the preliminary polysilicon pattern 310p, the preliminary first ohmic pattern 331p, the preliminary metal-containing pattern 330p, and the preliminary lower capping pattern 351p, at a boundary between the cell region CR and the boundary region BR. The preliminary boundary pattern BPp may be in contact with a side surface of the first peripheral insulating pattern 360, at the second interface BS2. The preliminary boundary pattern BPp may include silicon nitride. For example, the preliminary boundary pattern BPp may be formed of silicon nitride. The preliminary boundary pattern BPp may not include silicon oxide.

Referring to FIGS. 22 to 26, a lower mask layer 610, upper mask patterns 621, and a sacrificial layer 622 may be formed on the cell region CR, the peripheral region PR, and the boundary region BR. The lower mask layer 610 may be formed on the preliminary boundary pattern BPp to cover the entire region of the substrate 10. After the formation of the lower mask layer 610, the upper mask patterns 621 may be formed on the lower mask layer 610. The formation of the upper mask patterns 621 may include forming an upper mask layer to cover the lower mask layer 610 and patterning the upper mask layer using exposing and etching processes. The upper mask patterns 621 may be extended in the first direction D1, which is parallel to the top surface of the substrate 10, and may be spaced apart from each other in the second direction D2, which is parallel to the top surface of the substrate 10 and is not parallel to the first direction D1. The sacrificial layer 622 may be formed to conformally cover a top surface of the lower mask layer 610, top surfaces of the upper mask patterns 621, and side surfaces of the upper mask patterns 621.

Referring to FIGS. 27 to 31, the bit lines BL may be formed on the cell region CR. The cell trenches CTR and the boundary pattern BP may be formed on the cell region CR and the boundary region BR. The second peripheral insulating pattern 361 may be further formed on the peripheral region PR. The bit lines BL, the cell trenches CTR, the boundary pattern BP, and the second peripheral insulating pattern 361 may be formed by etching the preliminary polysilicon pattern 310p, the preliminary first ohmic pattern 331p, the preliminary metal-containing pattern 330p, the preliminary lower capping pattern 351p, and the preliminary boundary pattern BPp of FIG. 24.

In this etching process, the lower mask layer 610, the upper mask patterns 621, and the sacrificial layer 622 may be used as an etch mask. In detail, a portion of the sacrificial layer 622, which covers the top surface of the lower mask layer 610 and the top surfaces of the upper mask patterns 621, may be etched, and thus, portions of the sacrificial layer 622 covering the side surfaces of the upper mask patterns 621 may be left on the lower mask layer 610. The remaining portions of the sacrificial layer 622 may be extended in the first direction D1 and may be spaced apart from each other in the second direction D2. The remaining portions of the sacrificial layer 622 may have a bar shape. Thereafter, the upper mask patterns 621 may be removed. During this process, upper parts of portions of the lower mask layer 610 may be removed. For example, the portions of the lower mask layer 610 may be provided on regions, which are not covered with the upper mask patterns 621 and the remaining portions of the sacrificial layer 622. The lower mask layer 610 may be etched using the remaining portions of the sacrificial layer 622 as an etch mask. Thereafter, the preliminary polysilicon pattern 310p, the preliminary first ohmic pattern 331p, the preliminary metal-containing pattern 330p, the preliminary lower capping pattern 351p, and the preliminary boundary pattern BPp may be etched using a remaining portion of the lower mask layer 610 as an etch mask.

The cell trenches CTR may be formed between the remaining portions of the sacrificial layer 622. For example, the cell trenches CTR may be formed in regions which were occupied by the upper mask patterns 621 and the portions of the lower mask layer 610 in the previous step. In lower layers below the sacrificial layer 622, portions of the lower layer, which are covered by the remaining portions of the sacrificial layer 622, may not be etched, and remain in bar-shaped patterns. As a result, the bit line contacts DC, the polysilicon patterns 310, the bit lines BL, and the bit line capping patterns 350 may be formed on the cell region CR to have a bar shape. In addition, since the preliminary boundary pattern BPp is etched, the boundary pattern BP, the second peripheral insulating pattern 361, and the upper capping pattern 352 of the bit line capping patterns 350 may be formed at the same time. The boundary pattern BP may be formed on the boundary region BR. The second peripheral insulating pattern 361 may be formed on the peripheral region PR. The upper capping pattern 352 of the bit line capping pattern 350 may be formed on the cell region CR.

An etching amount in the etching process may be greater in a region provided with the portions of the lower mask layer 610 than in a region provided with the upper mask patterns 621. Accordingly, the cell trenches CTR in the region provided with the portion of the lower mask layer 610 may be longer than the cell trenches CTR in the region provided with the upper mask patterns 621, when measured in the first direction D1. As a result, on the boundary region BR, the first end portions E1 of the cell trenches CTR may be formed to form a zigzag shape in the second direction D2.

Although not shown, before the etching process using the remaining portions of the sacrificial layer 622 as an etch mask, the peripheral region PR and a portion of the boundary region BR adjacent to the peripheral region PR may be covered with a mask layer, and in this case, the cell trenches CTR may not be formed in the region covered with the mask layer. As a result, the first end portions E1 of the cell trenches CTR may be formed on the boundary region BR, not on the peripheral region PR.

The boundary pattern BP may be exposed through the cell trenches CTR. The boundary pattern BP may not include silicon oxide, like the preliminary boundary pattern BPp. Thus, a portion of the boundary pattern BP exposed by the cell trenches CTR may not include silicon oxide. Accordingly, the bit lines BL is not exposed to silicon oxide during a process of forming the same.

Referring back to FIGS. 2 to 6, the gap-fill pattern 380 and the storage node contacts BC may be formed. The storage node contacts BC may be formed between an adjacent pair of the bit lines BL. The storage node contacts BC may be spaced apart from each other in the first and second directions D1 and D2. Each of the storage node contacts BC may be electrically connected to a corresponding one of the second impurity regions 110b. During the process of forming the storage node contacts BC, a portion of the preliminary buffer pattern 305p of FIG. 29 may be etched to form the buffer pattern 305. The bit line spacer SP may be interposed between the storage node contacts BC and the bit lines BL adjacent thereto.

The second ohmic pattern 341 may be formed on each of the storage node contacts BC. The diffusion prevention pattern 342 may be formed to conformally cover the second ohmic pattern 341, the bit line spacer SP, and bit line capping pattern 350. The landing pads LP may be formed on the diffusion prevention patterns 342. Each of the landing pads LP may be electrically connected to a corresponding one of the storage node contacts BC. An upper portion of each of the landing pads LP may be shifted from a corresponding one of the storage node contacts BC in the second direction D2. For example, at least a portion of the upper portion of the landing pad LP may not overlap the storage node contact BC in the fourth direction D4.

The first interlayer insulating pattern 400 may be formed between the adjacent ones of the landing pads LP. The first interlayer insulating pattern 400 may be formed to extend to the boundary region BR and the peripheral region PR. The bit line contact plugs DCBL may be formed to sequentially penetrate the first interlayer insulating pattern 400, the bit line capping pattern 350, and the metal-containing pattern 330. The bit line contact plugs DCBL may be electrically connected to the bit lines BL, respectively. The peripheral contact plugs DCCP may be formed at both sides of each of the peripheral word lines PWL. Each of the peripheral contact plugs DCCP may be formed to sequentially penetrate the first interlayer insulating pattern 400, the second peripheral insulating pattern 361, and the first peripheral insulating pattern 360.

The bottom electrodes BE may be formed on the landing pads LP, respectively. The etch stop layer 420 may be formed on the cell region CR, the boundary region BR, and the peripheral region PR. The etch stop layer 420 may be formed between the bottom electrodes BE and on the first interlayer insulating pattern 400. The upper supporting pattern SS1 may be formed to support upper side surfaces of the bottom electrodes BE, and the lower supporting pattern SS2 may be formed to support lower side surfaces of the bottom electrodes BE. The dielectric layer DL may be formed to cover surfaces of the bottom electrodes BE and surfaces of the upper and lower supporting patterns SS1 and SS2, and the top electrode TE may be formed on the dielectric layer DL to fill a space between the bottom electrodes BE. The bottom electrodes BE, the dielectric layer DL, and the top electrode TE may constitute the capacitor CA.

The second interlayer insulating pattern 500 may be formed on the cell region CR, the boundary region BR, and the peripheral region PR. The second interlayer insulating pattern 500 may be formed on the etch stop layer 420. The second interlayer insulating pattern 500 may be formed to cover the side surface of the capacitor CA.

The metal contacts MC may be formed to penetrate the second interlayer insulating pattern 500. The metal contacts MC may be formed to be in contact with the bit line contact plugs DCBL and the peripheral contact plugs DCCP, respectively. The second interlayer insulating pattern 500 may be formed to cover the side surfaces of the metal contacts MC.

In the case where the bit lines BL are exposed to silicon oxide during an etching process for forming the bit lines BL, the bit lines BL may not be passivated effectively. Accordingly, in the case where the bit lines BL are over-etched, widths of the bit lines BL may be reduced. Especially, in the case where the first peripheral insulating pattern 360 is etched in the process of forming the bit lines BL, the silicon oxide in the first peripheral insulating pattern 360 may lead to a reduction in width of an end portion of each of the bit lines BL. This may cause an increase in electric resistance of the bit lines BL and a contact failure between the bit lines BL and the bit line contact plugs DCBL.

According to an embodiment of the inventive concept, the boundary pattern BP, which does not include silicon oxide, may be provided between the cell region CR and the peripheral region PR. The boundary pattern BP may prevent the first peripheral insulating pattern 360 from being exposed during an etching process for forming the bit lines BL, and thus, it may be possible to prevent the end portions of the bit lines BL from having a reduced width during the etching process. Accordingly, the electric resistance of the bit lines BL may be lowered, and it may be possible to prevent the contact failure between the bit lines BL and the bit line contact plugs DCBL. As a result, the electric and reliability characteristics of a semiconductor device may be improved. In addition, since the widths of the bit lines BL can be easily adjusted, the semiconductor device can be easily scaled down.

According to an embodiment of the inventive concept, a boundary pattern may be disposed between a cell region and a peripheral region. The boundary pattern may prevent or suppress an over-etching issue of bit lines caused by a silicon oxide layer on the peripheral region, when an etching process is performed to form the bit lines in the cell region. Accordingly, it may be possible to suppress a phenomenon in which a width of each bit line is reduced at an end portion of the bit line. Furthermore, it may be possible to reduce an electric resistance of the bit lines and to prevent a contact failure from occurring between the bit lines and bit line contact plugs. As a result, it may be possible to improve electric and reliability characteristics of a semiconductor device. In addition, since the width of the bit lines can be easily adjusted, the semiconductor device can be easily scaled down.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor device, comprising:
a substrate including a cell region, a peripheral region, and a boundary region between the cell region and the peripheral region;
bit lines provided on the cell region and extended in a first direction parallel to a top surface of the substrate;
bit line capping patterns provided on the bit lines;
a boundary pattern provided on the boundary region;
bit line spacers contacting sides of the bit lines, and
cell trenches provided between the bit lines and extended from the cell region to the boundary region in the first direction,
wherein end portions of the bit lines are in contact with a first interface of the boundary pattern,
the bit line spacers extend through the cell region and beyond the end portions of the bit lines in the first direction,
the bit line capping patterns comprise the same material as the boundary pattern, and
wherein the cell trenches comprise first end portions which are extended into the boundary pattern.

2. The semiconductor device of claim 1, wherein the first interface of the boundary pattern is formed of silicon nitride.

3. The semiconductor device of claim 1, wherein the boundary pattern is formed of silicon nitride.

4. The semiconductor device of claim 1, wherein the bit line capping patterns comprise an upper capping pattern, and the upper capping pattern comprises the same material as the boundary pattern.

5. The semiconductor device of claim 1, further comprising a buffer pattern on the cell region and the boundary region, wherein the boundary pattern is provided on the buffer pattern.

6. The semiconductor device of claim 1, wherein a portion of the boundary pattern forms at least a portion of an inner side surface of the respective cell trenches, on the boundary region.

7. The semiconductor device of claim 6, wherein the portion of the boundary pattern is formed of silicon nitride.

8. The semiconductor device of claim 1, wherein the first end portions of the cell trenches are arranged to form a zigzag shape in a second direction, which is parallel to the top surface of the substrate and crosses the first direction.

9. The semiconductor device of claim 1, wherein the first end portions of the cell trenches are closer to the peripheral region than the end portions of the bit lines.

10. A semiconductor device, comprising:
a substrate including a cell region, a peripheral region, and a boundary region between the cell region and the peripheral region;
bit lines provided on the cell region and extended in a first direction parallel to a top surface of the substrate;
bit line capping patterns on the bit lines;
cell trenches provided between the bit lines and extended from the cell region to the boundary region in the first direction; and
a boundary pattern, including a first interface, provided on the boundary region,
wherein the cell trenches comprise first end portions which are extended into the boundary pattern,
wherein the bit line capping patterns comprise the same material as the boundary pattern, and
inner sides of the first end portions of the cell trenches are defined by the first interface of the boundary pattern.

11. The semiconductor device of claim 10, further comprising bit line spacers covering the inner sides of the first end portions of the cell trenches and sides of bit lines, wherein the bit line spacers are in contact with the first interface of the boundary pattern on the inner sides of the first end portions of the cell trenches.

12. The semiconductor device of claim 11, wherein the first interface of the boundary pattern is formed of silicon nitride.

13. The semiconductor device of claim 10, wherein the first end portions of the cell trenches are arranged to form a zigzag shape in a second direction, which is parallel to the top surface of the substrate and crosses the first direction.

14. The semiconductor device of claim 10, wherein the bit line capping patterns comprise an upper capping pattern, and
the upper capping pattern includes the same material as the boundary pattern.

15. A semiconductor device, comprising:
a substrate including a cell region, a peripheral region, and a boundary region between the cell region and the peripheral region;
bit lines provided on the cell region and extended in a first direction parallel to a top surface of the substrate;
bit line capping patterns on the bit lines;
storage node contacts disposed between the bit lines;
landing pads provided on the bit line capping patterns and the storage node contacts, and electrically connected to the storage node contacts;
capacitors provided on the landing pads and electrically connected to the landing pads;
cell trenches provided between the bit lines and extended from the cell region to the boundary region in the first direction; and
a boundary pattern provided on the boundary region,
wherein end portions of the bit lines are in contact with a first interface of the boundary pattern,
the cell trenches comprise first end portions extended into the boundary pattern,
the bit line capping patterns comprise the same material as the boundary pattern, and
inner sides of the first end portions of the cell trenches are defined by first interfaces of the boundary pattern.

16. The semiconductor device of claim 15, wherein the first interface of the boundary pattern is formed of silicon nitride.

17. The semiconductor device of claim 15, wherein a portion of the boundary pattern forms inner side surfaces of the cell trenches, on the boundary region, and
the portion of the boundary pattern is formed of silicon nitride.

18. The semiconductor device of claim 15, wherein the boundary pattern is formed of silicon nitride.

19. The semiconductor device of claim 15, wherein the bit line capping patterns comprise an upper capping pattern, and
the upper capping pattern includes the same material as the boundary pattern.

* * * * *